(12) United States Patent
Lee et al.

(10) Patent No.: US 6,876,068 B1
(45) Date of Patent: Apr. 5, 2005

(54) SEMICONDUCTOR PACKAGE WITH INCREASED NUMBER OF INPUT AND OUTPUT PINS

(75) Inventors: Choon Heung Lee, Kyounggi-do (KR); Donald C. Foster, Mesa, AZ (US); Jeoung Kyu Choi, Incheon-shi (KR); Wan Jong Kim, Incheon-shi (KR); Kyong Hoon Youn, Incheon-shi (KR); Sang Ho Lee, Seoul (KR); Sun Goo Lee, Kyounggi-do (KR)

(73) Assignee: Amkor Technology, Inc, Chandler, AZ (US)

(*) Notice: Subject to any disclaimer, the term of this patent is extended or adjusted under 35 U.S.C. 154(b) by 0 days.

(21) Appl. No.: 10/447,012

(22) Filed: May 28, 2003

Related U.S. Application Data

(63) Continuation-in-part of application No. 10/237,293, filed on Sep. 9, 2002, now Pat. No. 6,818,973.

(51) Int. Cl.[7] .......................................... H01L 23/495
(52) U.S. Cl. ..................... 257/676; 257/666; 257/670
(58) Field of Search ............................. 257/666, 670, 257/676

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,646,710 A | 3/1987 | Schmid et al. |
| 4,707,724 A | 11/1987 | Suzuki et al. |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |

(Continued)

*Primary Examiner*—Nathan J. Flynn
*Assistant Examiner*—Victor A. Mandala, Jr.
(74) *Attorney, Agent, or Firm*—Stetina Brunda Garred & Brucker

(57) ABSTRACT

In accordance with the present invention, there is provided a semiconductor package which includes a generally planar die paddle defining multiple peripheral edge segments and including at least two slots formed therein and extending along respective ones of a pair of the peripheral edge segments thereof. The semiconductor package further comprises a plurality of first leads which are segregated into at least two sets disposed within respective ones of the slots included in the die paddle. In addition to the first leads, the semiconductor package includes a plurality of second leads which are also segregated into at least two sets extending along respective ones of at least two peripheral edge segments of the die paddle in spaced relation thereto. Electrically connected to the top surface of the die paddle is at least one semiconductor die which is electrically connected to at least some of each of the first and second leads. At least portions of the die paddle, the first and second leads, and the semiconductor die are encapsulated by a package body, the bottom surfaces of the die paddle and the first leads being exposed in a common exterior surface of the package body.

24 Claims, 20 Drawing Sheets

U.S. PATENT DOCUMENTS

| | | |
|---|---|---|
| 5,029,386 A | 7/1991 | Chao et al. |
| 5,041,902 A | 8/1991 | McShane |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasaranthi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,018,189 A | 1/2000 | Mizuno |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,722 A | 7/2000 | Lee et al. |
| 6,100,594 A | 8/2000 | Fukui et al. |
| 6,113,474 A | 9/2000 | Shih et al. |
| 6,118,174 A | 9/2000 | Kim |

| | | |
|---|---|---|
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,329,706 B1 * | 12/2001 | Nam .......................... 257/666 |
| 6,339,255 B1 | 1/2002 | Shin |
| 6,348,726 B1 | 2/2002 | Bayan et al. |
| 6,355,502 B1 | 3/2002 | Kang et al. |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,414,385 B1 | 7/2002 | Huang et al. |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,464,121 B2 | 10/2002 | Reijnders |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,120 B2 | 1/2003 | Lo et al. |
| 6,559,525 B2 | 5/2003 | Huang |
| 6,627,976 B1 * | 9/2003 | Chung et al. ............... 257/666 |
| 6,662,083 B2 * | 12/2003 | Angel ......................... 700/248 |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0073265 A1 | 4/2003 | Hu et al. |
| 2004/0056337 A1 * | 3/2004 | Hasebe et al. .............. 257/667 |
| 2004/0159918 A1 * | 8/2004 | Lee ............................ 257/670 |
| 2004/0183170 A1 * | 9/2004 | Tomimatsu ................. 257/666 |

* cited by examiner

US 6,876,068 B1

SEMICONDUCTOR PACKAGE WITH INCREASED NUMBER OF INPUT AND OUTPUT PINS

CROSS-REFERENCE TO RELATED APPLICATIONS

The present application is a continuation-in-part of U.S. application Ser. No. 10/237,293 entitled EXPOSED LEAD QFP PACKAGE USING PARTIAL SAW PROCESS filed Sep. 9, 2002, now U.S. Pat. No. 6,818,973, the disclosure of which is incorporated herein by reference.

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a QFP semiconductor package which includes stacked semiconductor dies and exposed leads on the bottom of the package body thereof.

2. Description of the Related Art

Integrated circuit dies are conventionally enclosed in plastic packages that provide protection from hostile environments and enable electrical interconnection between the integrated circuit die and an underlying substrate such as a printed circuit board (PCB). The elements of such a package include a metal leadframe, an integrated circuit die, bonding material to attach the integrated circuit die to the leadframe, bond wires which electrically connect pads on the integrated circuit die to individual leads of the leadframe, and a hard plastic encapsulant material which covers the other components and forms the exterior package body of the semiconductor package.

The leadframe is the central supporting structure of such a package. A portion of the leadframe is internal to the package, i.e., completely surrounded by the package body. Portions of the leads of the leadframe extend externally from the package body of the package, or are partially exposed within the package body for use in electrically connecting the semiconductor package to another component. In certain semiconductor packages, a portion of the die pad of the leadframe also remains exposed within the package body for use as a heat sink.

One type of semiconductor package commonly known in the electronics field is referred to as a quad flat pack (QFP) package. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pads is exposed within the bottom surface of the package body.

In the electronics industry and, in particular, in high frequency applications such as cell phones, PDA's, Bluetooth, and IMT2000, there is an increasing need for QFP exposed pad packages of increased functional capacity.

The present invention provides such a QFP exposed pad package wherein stacked semiconductor dies are encapsulated by the package body and leads are exposed within the bottom surface of the package body. The semiconductor package of the present invention is provided through the use of standard, low-cost leadframe design techniques. These, as well as other features and attributes of the present invention, will be discussed in more detail below.

BRIEF SUMMARY OF THE INVENTION

In accordance with the present invention, there are provided multiple embodiments of a semiconductor package, each embodiment including a uniquely configured leadframe sized and configured to maximize the available number of exposed leads in the semiconductor package. The leadframe of each embodiment of the semiconductor package is fabricated in accordance with standard, low-cost forming techniques, with sawing or similar cutting procedures being completed during the fabrication of the semiconductor package which effectively electrically isolate various sets of the leads from each other within the completed semiconductor package. The semiconductor package of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
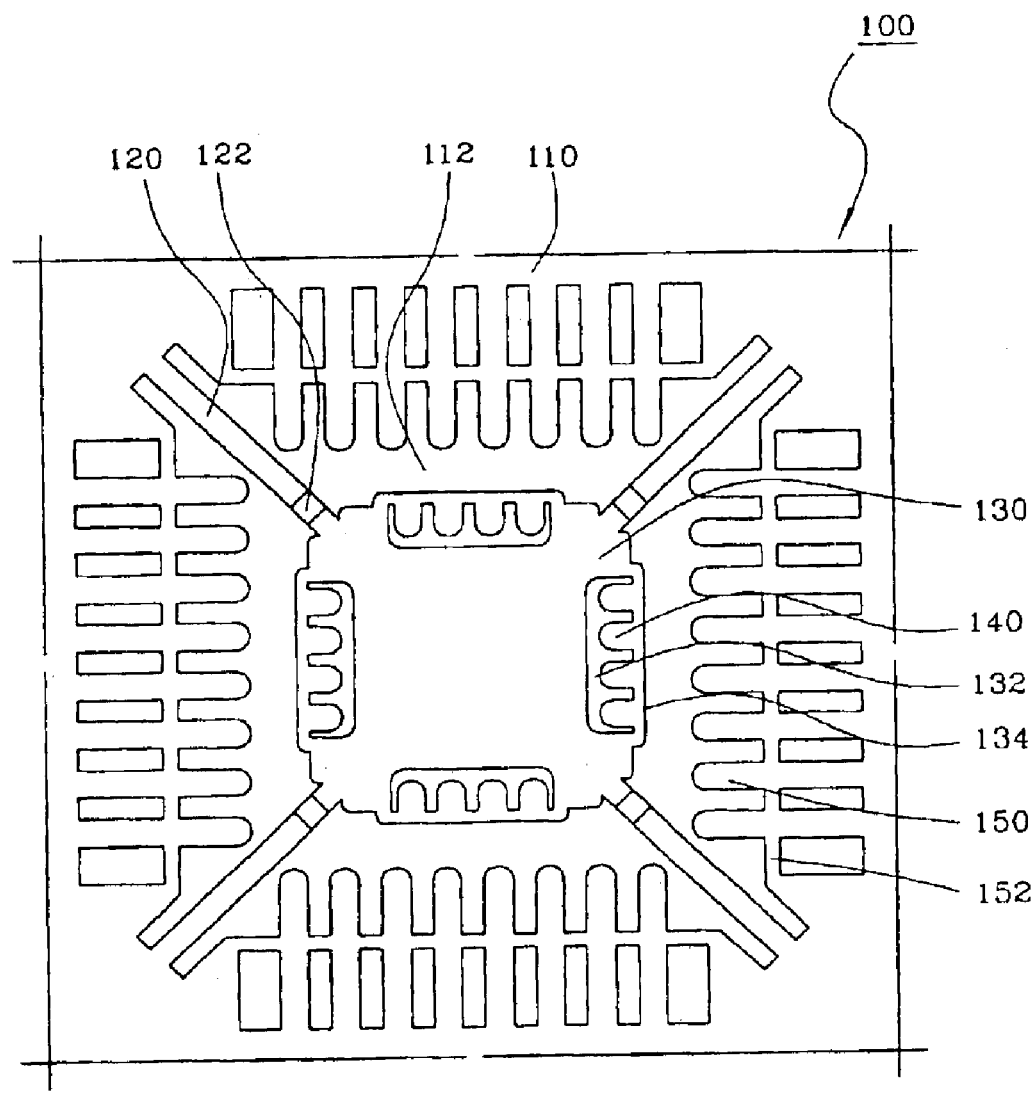
FIG. 1 is a top plan view of a leadframe used to fabricate a semiconductor package constructed in accordance with a first embodiment of the present invention.
Figure 2A:
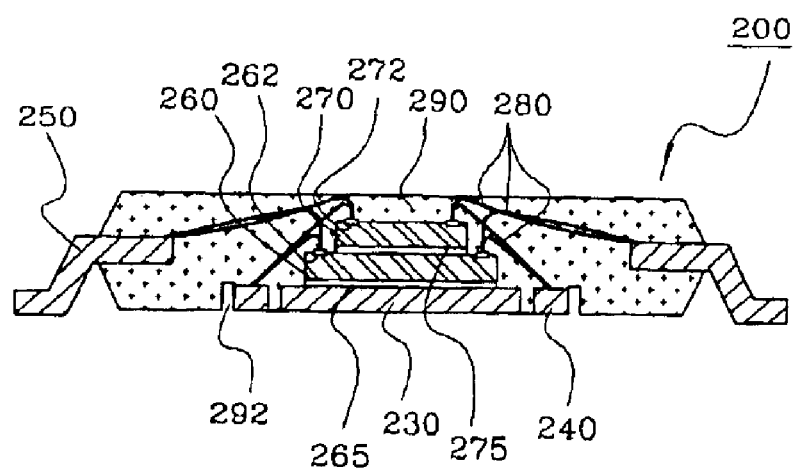
FIG. 2A is a cross-sectional view of the semiconductor package of the first embodiment.
Figure 2B:
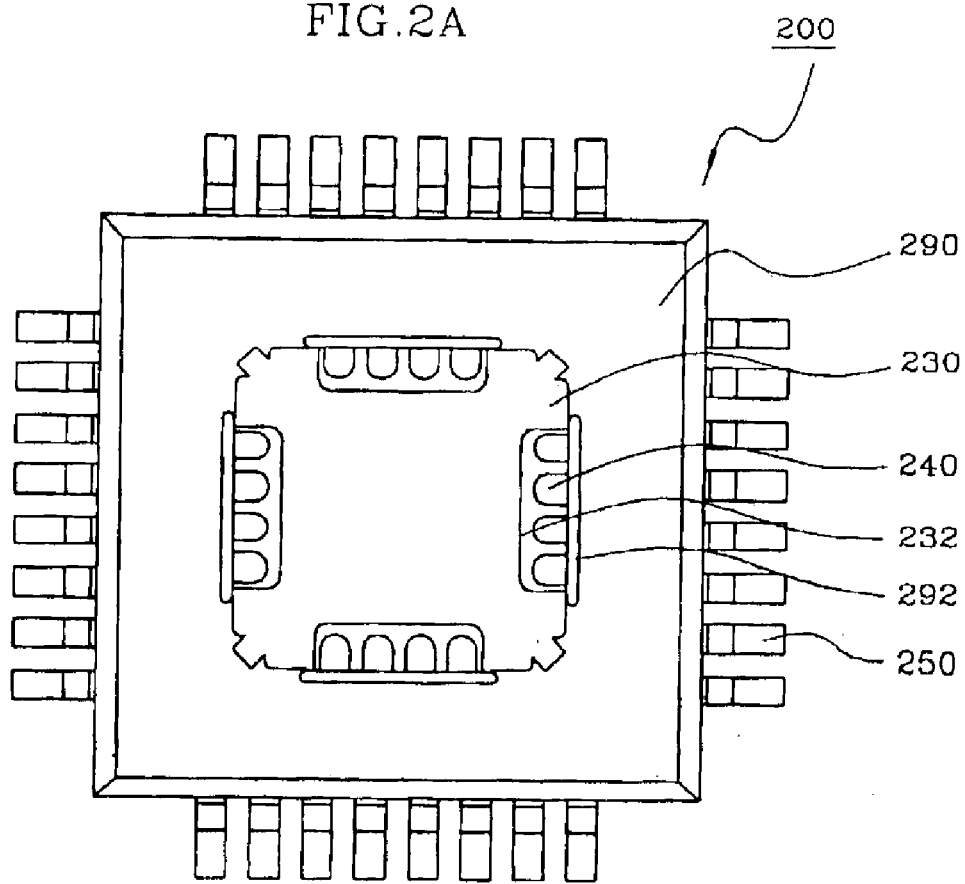
FIG. 2B is a bottom plan view of the semiconductor package of the first embodiment shown in FIG. 2A.

Referring now to the drawings wherein the showings are for purposes of illustrating various embodiments of the present invention only, and not for purposes of limiting the same, FIG. 1 provides a plan view of a leadframe 100 which is used to fabricate a semiconductor package 200 constructed in accordance with a first embodiment of the present invention, as is seen in FIGS. 2A and 2B. The leadframe 100 is generally planar, and includes a peripheral outer frame 110 which is quadrangular in shape and defines a central opening 112. Located within the central opening 112 of the outer frame 110 is a generally quadrangular die paddle 130. The die paddle 130 is connected to the outer frame 110 by a plurality of tie bars 120 which extend diagonally from respective ones of four corners defined by the die paddle 130. In addition to the outer frame 110, tie bars 120 and die paddle 130, the leadframe 100 includes a plurality of first leads 140 which are connected to the die paddle 130, and a plurality of second leads 150 which are connected to the outer frame 110 and extend within the central opening 112 toward the die paddle 130.

As seen in FIG. 1, the second leads 150 are segregated into four sets, with the second leads 150 of each set extending toward a respective one of the four peripheral edge segments defined by the die paddle 130 in spaced relation thereto. The first leads 140 are also segregated into four sets which extend along respective ones of the four peripheral edge segments defined by the die paddle 130. In the leadframe 100, each set of the first leads 140 is defined by a respective one of four slots 132 formed in the die paddle 130. As a result of the inclusion of the slots 132 therein, the die paddle 130 defines four supporting bars 134, each of which defines a portion of a respective one of the four peripheral edge segments of the die paddle 130. The first leads 140 of each set are connected to and extend inwardly from a respective one of the supporting bars 134.

In the leadframe 100, the generally planar die paddle 130 does not extend in co-planar relation to the generally planar outer frame 110. Rather, each tie bar 120 is preferably formed to include a downset portion 122 which results in the die paddle 130 residing on a plane which is disposed below the plane of the outer frame 110. In the leadframe 100, dambars 152 are used to provide support to the second leads 150 by connecting the second leads 150 to the outer frame 110 and to each other.

The leadframe 100 shown in FIG. 1 is preferably fabricated from a conventional metal material, such as copper, copper alloy, steel plated with copper, or a functional equivalent. However, those of ordinary skill in the art will recognize that the present invention is not limited to any particular material for the leadframe 100. Additionally, the number, position and path of the first and second leads 140, 150 as shown in FIG. 1 is for illustrative purposes only, and may be modified according to application field. Along these lines, the first and second leads 140, 150 may have alternative designs or configurations, depending on the number and position of the pads or terminals of the semiconductor die(s) of the semiconductor package 200. Though, as shown in FIG. 1, the leadframe 100 is generally square, it may alternatively have a rectangular configuration. Additionally, though the first and second leads 140, 150 are shown as each being segregated into four sets, it will be recognized that fewer sets of the first and second leads 140, 150 may be provided, and may be arranged along any combination of two or three of the peripheral sides of the die paddle 130. Moreover, less than four tie bars 120 may be included in the leadframe 100, extending to respective corners of the die paddle 130 in any combination. As an alternative to the inclusion of the tie bars 120, one or more of the second leads 150 can be directly connected to the die paddle 130. The dambars 152 also need not necessarily be included in the leadframe 100. The above-described potential structural variations are also applicable to alternative embodiments of the leadframe which will be described in more detail below.

The semiconductor package 200 fabricated through the use of the leadframe 100 is shown in FIGS. 2A and 2B. The semiconductor package 200 includes a die paddle 230, a plurality of first leads 240, and a plurality of second leads 250. As will be recognized, the die paddle 230 corresponds to the die paddle 130 shown in FIG. 1, with the first and second leads 240, 250 corresponding to the first and second leads 140, 150 shown in FIG. 1. In this regard, the first leads 240 are formed as a result of the inclusion of the slots 232 in the die paddle 230, the slots 232 corresponding to the slots 132 shown in FIG. 1.

The semiconductor package 200 further includes a semiconductor die 260 which is attached to the top surface of the die paddle 230. The semiconductor die 260 is preferably bonded to the top surface of the die paddle 230 through the use of a die attach material 265. Included on the top surface of the semiconductor die 260 is a plurality of terminals or bond pads 262. Additionally, attached to the top surface of the semiconductor die 260 is another semiconductor die 270. The upper semiconductor die 270 is attached to the lower semiconductor die 260 through the use of a die attach material 275. Included on the top surface of the semiconductor die 270 is a plurality of terminals or bond pads 272. The inclusion of the second or upper semiconductor die 270 in the semiconductor package 200 is optional depending on functionality requirements. Due to its inclusion of the stacked semiconductor dies 260, 270, the semiconductor package 200 may be used in a wide range of diverse applications.

As seen in FIG. 2A, the bond pads 262, 272 of the semiconductor dies 260, 270 are electrically connected to respective ones of the first and second leads 240, 250 through the use of conductive wires 280. In this regard, the bond pads 262, 272 through which high frequency signals are intended to pass are typically electrically connected to the first leads 240 through the use of the conductive wires 280, wherein the bond pads 262, 272 through which low frequency signals pass are typically electrically connected to the second leads 250. The conductive wires 280 may be fabricated from aluminum, copper, gold, silver, or a functional equivalent. However, those of ordinary skill in the art will recognize that the present invention is not limited to any particular material for the conductive wires 280.

In the semiconductor package 200, the die paddle 230, first and second leads 240, 250, semiconductor dies 260, 270 and conductive wires 280 are encapsulated by an encapsulant material which, upon hardening, forms a package body 290 of the semiconductor package 200. As seen in FIG. 2B, the bottom surfaces of the die paddle 230 and the first leads 240 are exposed in and substantially flush with the bottom surface of the package body 290. Distal portions of the second leads 250 protrude from respective ones of four side surfaces defined by the package body. The exposed portions of the second leads 250 are preferably bent so as to impart a generally gull-wing configuration thereto. The inner portions of the second leads 250 which are encapsulated by the package body 290 are not exposed in the bottom surface thereof as a result of the downset of the die paddle 230 (and hence the first leads 240) relative thereto. The semiconductor package 200 may be mounted to an external device through the use of the first leads 240 which are exposed in the bottom surface of the package body 290, and also through the use of the second leads 250 which protrude from the side surfaces of the package body 290.

As seen in FIG. 2B, formed in the bottom surface of the package body 290 are four generally straight recesses 292. As will be discussed in more detail below, the recesses 292 are formed in a manner effectively removing the above-described supporting bars 134 from the leadframe 100, thus electrically isolating the first leads 240 from the die paddle 230 and each other.

Figure 9A:
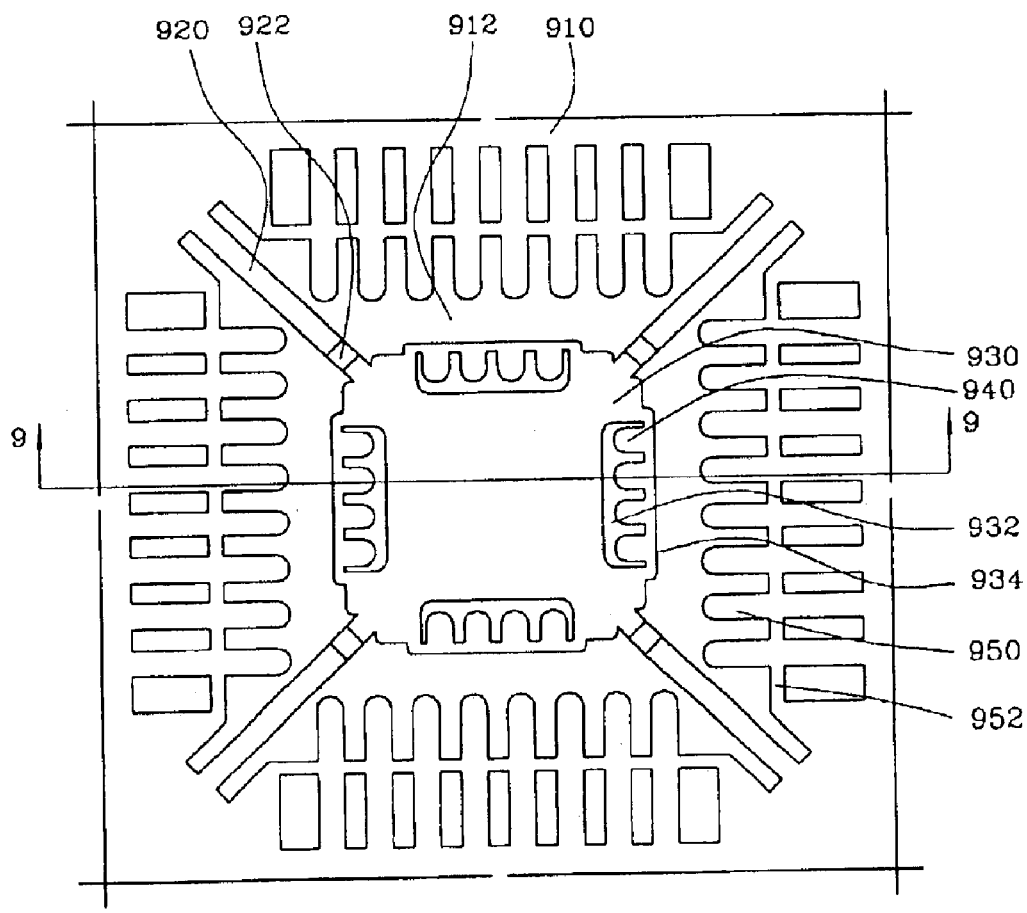
FIGS. 9A–9G are step-by-step illustrations of an exemplary method used to fabricate the semiconductor package of the first embodiment shown in FIGS. 2A and 2B.
Figure 9B:
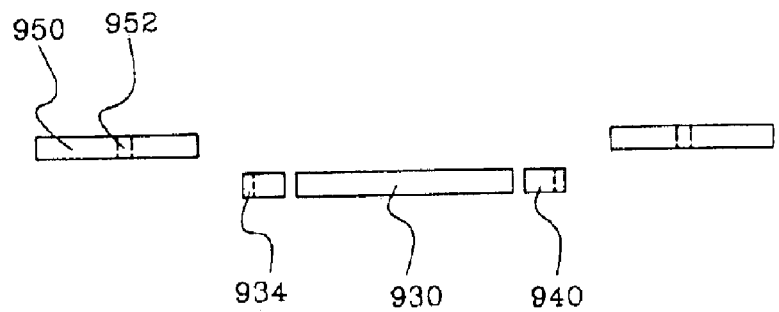
Figure 9C:
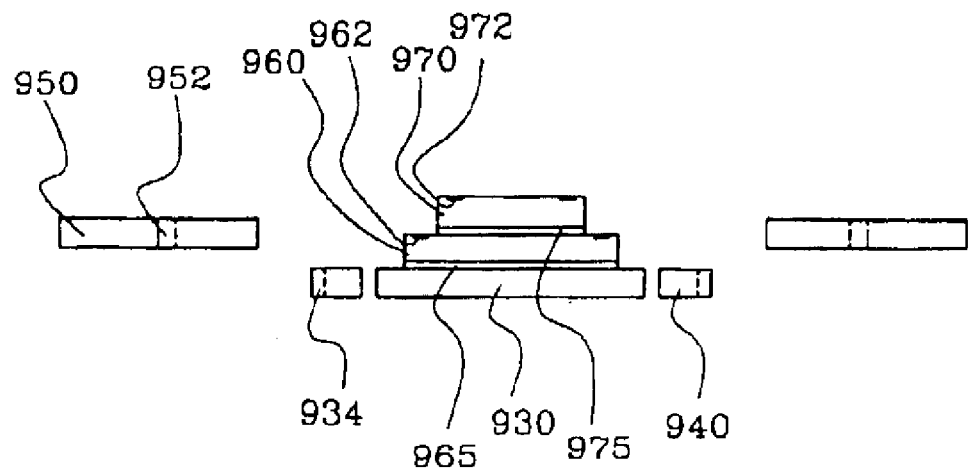
Figure 9D:
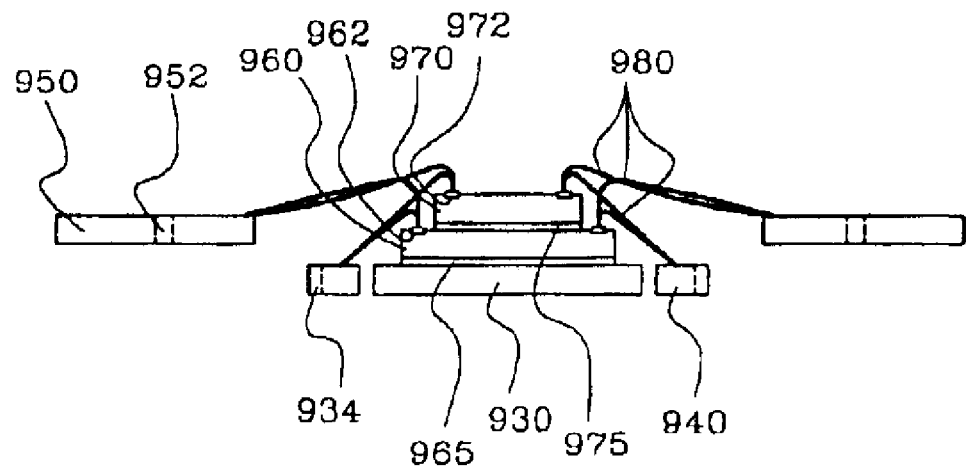

FIGS. 9A–9G provide step-by-step illustrations of an exemplary method for fabricating the semiconductor package 200 shown in FIGS. 2A and 2B. It should be noted that the various elements labeled with the 900 series reference numerals in FIGS. 9A–9G correspond to the same elements labeled with the 100 and 200 series reference numerals in FIGS. 1, 2A and 2B. In the initial steps of the exemplary method, the above-described leadframe 100 is provided (FIGS. 9A and 9B). Thereafter, the first, lower semiconductor die 960 is attached to the top surface of the die paddle 930 through the use of the die attach material 965, with the second, upper semiconductor die 970 then being bonded to the top surface of the lower semiconductor die 960 through the use of the die attach material 975 (FIG. 9C). The bond pads 962, 972 of the semiconductor dies 960, 970 are then electrically connected to the first and second leads 940, 950 through the use of the conductive wires 980 (FIG. 9D). As indicated above in relation to FIG. 2A, the bond pads 962, 972 for high frequency signals are typically electrically connected to the first leads 940 through the use of the conductive wires 980, with the bond pads 962, 972 for general or low frequency signals being electrically connected to the second leads 950 through the use of the conductive wires 980.

Figure 9E:
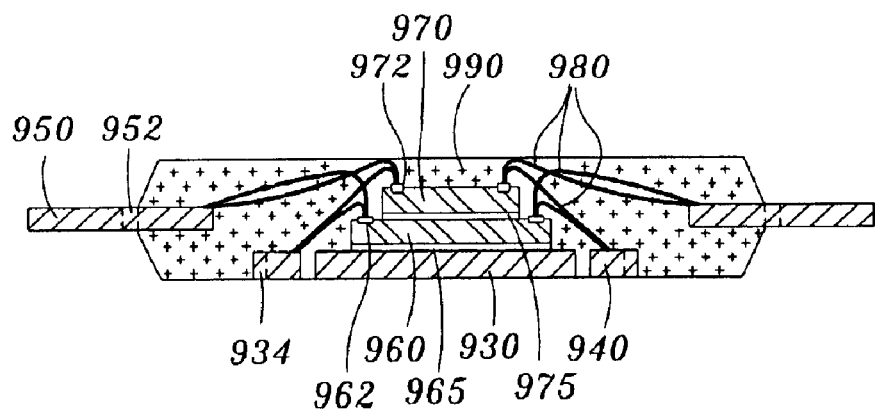

Thereafter, the package body 990 is formed through the use of conventional molding techniques (FIG. 9E). As indicated above in relation to FIGS. 2 and 2A, the bottom surfaces of the die paddle 930 and first leads 940 are exposed in and substantially flush with the bottom surface of the package body 990. Also exposed in and substantially flush with the bottom surface of the package body 990 are the bottom surfaces of the supporting bars 934. The second leads 950 protrude from respective side surfaces of the package body 990.

Figure 9F:
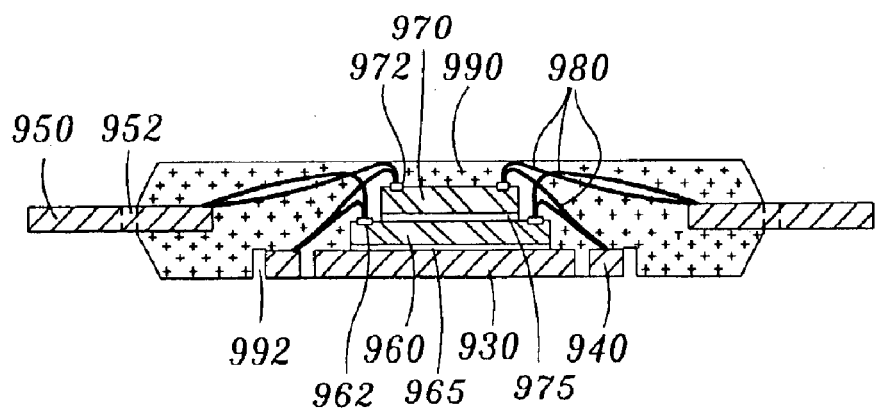
Figure 9G:
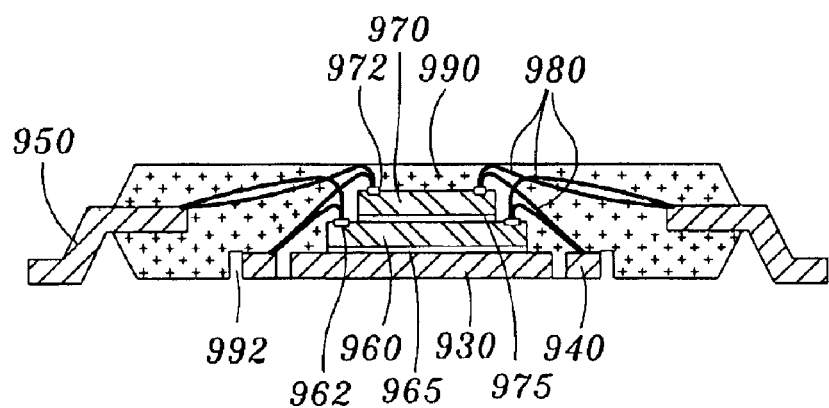

Subsequent to the formation of the package body 990, a partial sawing step is completed (FIG. 9F). In this partial sawing step, the supporting bars 934 exposed in the packaged body 990 are sawed in a manner effectuating their complete removal, thus effectively electrically isolating or insulating the first leads 940 from each other. The penetration of the saw into the package body 990 preferably occurs to a depth which slightly exceeds the thickness of the supporting bars 934, thus ensuring their complete removal and resultant electrical insulation of the first leads 940 from each other. The removal process may be completed through the use of a diamond blade method, a waterjet method, a laser method, a grinding method, or a chemical etching method. However, those of ordinary skill in the art will recognize that the present invention is not limited to any particular method for the removal of the supporting bars 934. As a result of the completion of the sawing or other removal process, recesses 992 are formed in the bottom surface of the package body 990, the recesses 992 corresponding to the recesses 292 shown in FIGS. 2A and 2B. Either prior or subsequent to the above-described sawing process, the dambars 952 (corresponding to the dambars 152 shown in FIG. 1) may be removed through conventional processes, thus effectively electrically isolating the second leads 950 from each other.

The last step of the method involves the cutting or singulation of the oilier frame 910 from the tie bars 920 and second leads 950. Either prior or subsequent to such singulation, the second leads 950 are subjected to a bending operation (FIG. 9G) so as to impart a generally gull-wing configuration thereto. The completion of these bending and singulation processes completes the formation of the semiconductor package 200 shown in FIGS. 2A and 2B.

Figure 3:
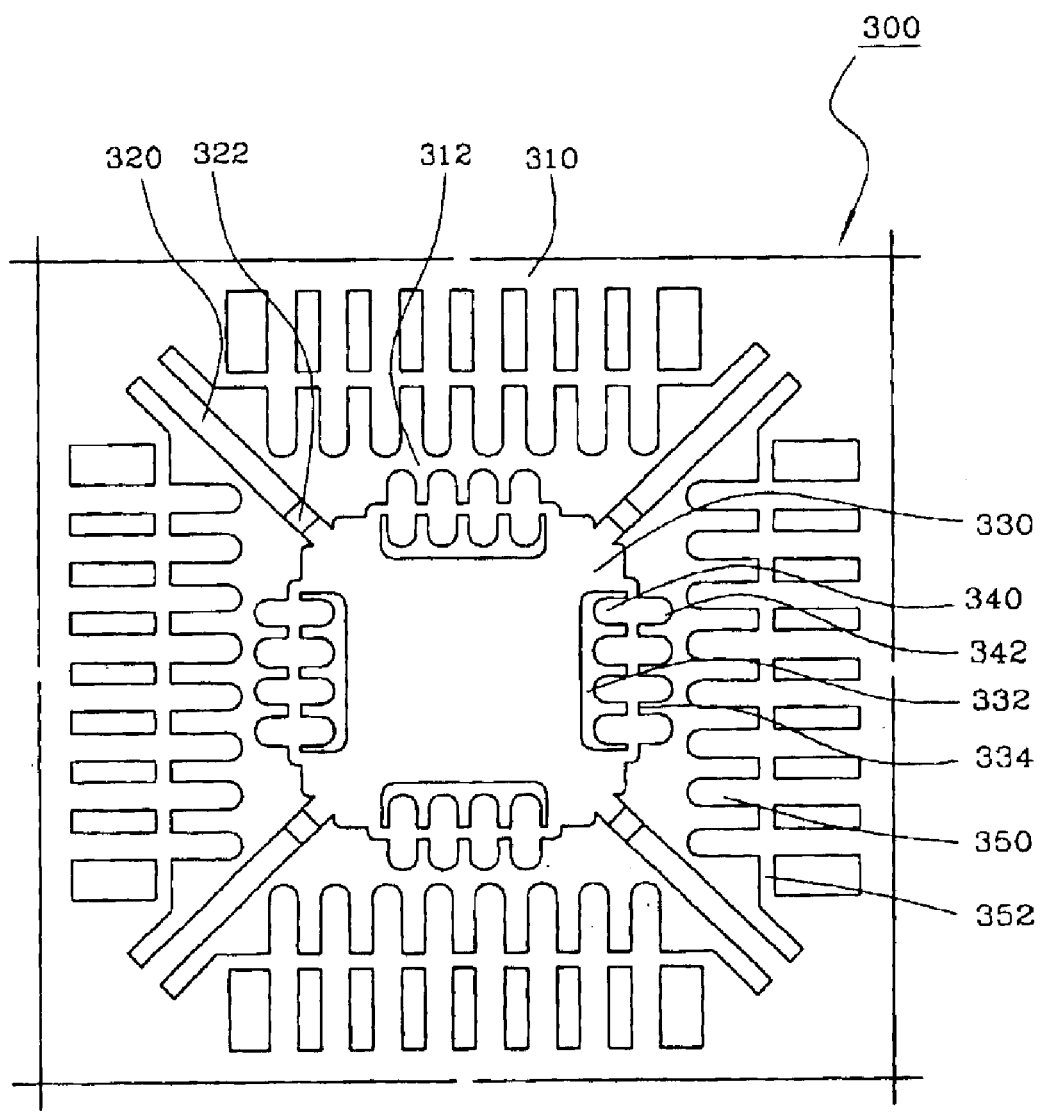
FIG. 3 is a top plan view of a leadframe used to fabricate a semiconductor package constructed in accordance with a second embodiment of the present invention.
Figure 4A:
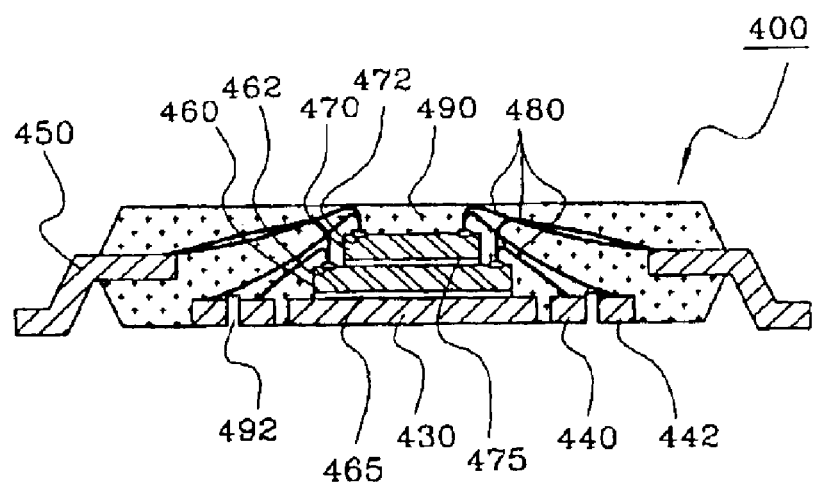
FIG. 4A is a cross-sectional view of the semiconductor package of the second embodiment.
Figure 4B:
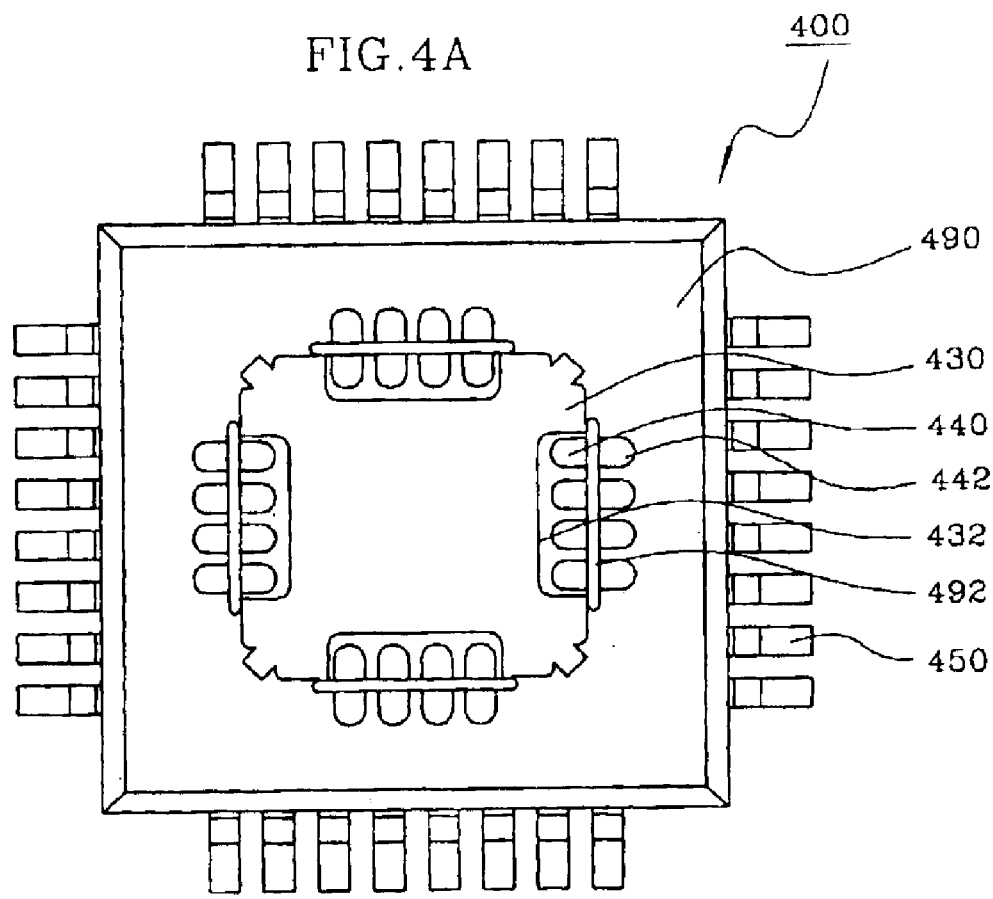
FIG. 4B is a bottom plan view of the semiconductor package of the second embodiment shown in FIG. 4A.

Referring now to FIG. 3, there is shown a leadframe 300 constructed in accordance with a second embodiment of the present invention which is used to fabricate a semiconductor package 400 of a second embodiment as is seen in FIGS. 4A and 4B. The leadframe 300 is substantially similar in structure to the leadframe 100 of the first embodiment described above. In this regard, various elements labeled with the 300 series reference numerals in FIG. 3 correspond to the same elements labeled with the 100 series reference numerals in FIG. 1. The structural distinction between the leadframes 300, 100 lies in that the leadframe 300 further includes four sets of third leads 342. The third leads 342 of each set are connected to and extend outwardly from a respective one of the supporting bars 334. The third leads 342 of each set also extend in opposed relation to a respective one of the first leads 340 of the corresponding set connected to the common supporting bar 334. Though the first and third leads 340, 342 are shown in FIG. 3 as being located on both sides of each supporting bar 334 symmetrically, those of ordinary skill in the art will recognize that the first and third leads 340, 342 of each set may be oriented asymmetrically relative to the common supporting bar 334.

The semiconductor package 400 fabricated through the use of the leadframe 300 is shown in FIGS. 4A and 4B. The various elements labeled with the 400 series reference numerals in FIGS. 4A and 4B correspond to the same elements labeled with the 200 and 300 series reference numerals in FIGS. 2A, 2B and 3. The primary distinction between the semiconductor package 400 and the semiconductor package 200 lies in the addition of the third leads 442 in the semiconductor package 400. As is seen in FIGS. 4A and 4B, the package body 490 of the semiconductor package 400 is formed such that the bottom surfaces of the third leads 442 are exposed in and substantially flush with the bottom surface of the package body 490, as are the bottom surfaces of the die paddle 430 and first leads 440. The recesses 492 formed in the bottom surface of the package body 490 as a result of the removal of the above-described supporting bars 334 from the leadframe 300 electrically isolate the first and third leads 440, 442 from the die paddle 430 and from each other. In the semiconductor package 400, additional conductive wires 480 are used to electrically connect certain bond pads 462, 472 of the semiconductor dies 460, 470 to the top surfaces of the third leads 442.

The manufacturing process for the semiconductor package 400 essentially mirrors that used in relation to the semiconductor package 200 as described above. In this regard, the recesses 492 shown in FIGS. 4A and 4B are formed in the same manner described above in relation to the recesses 992 shown in FIGS. 9F and 9G.

Figure 5:
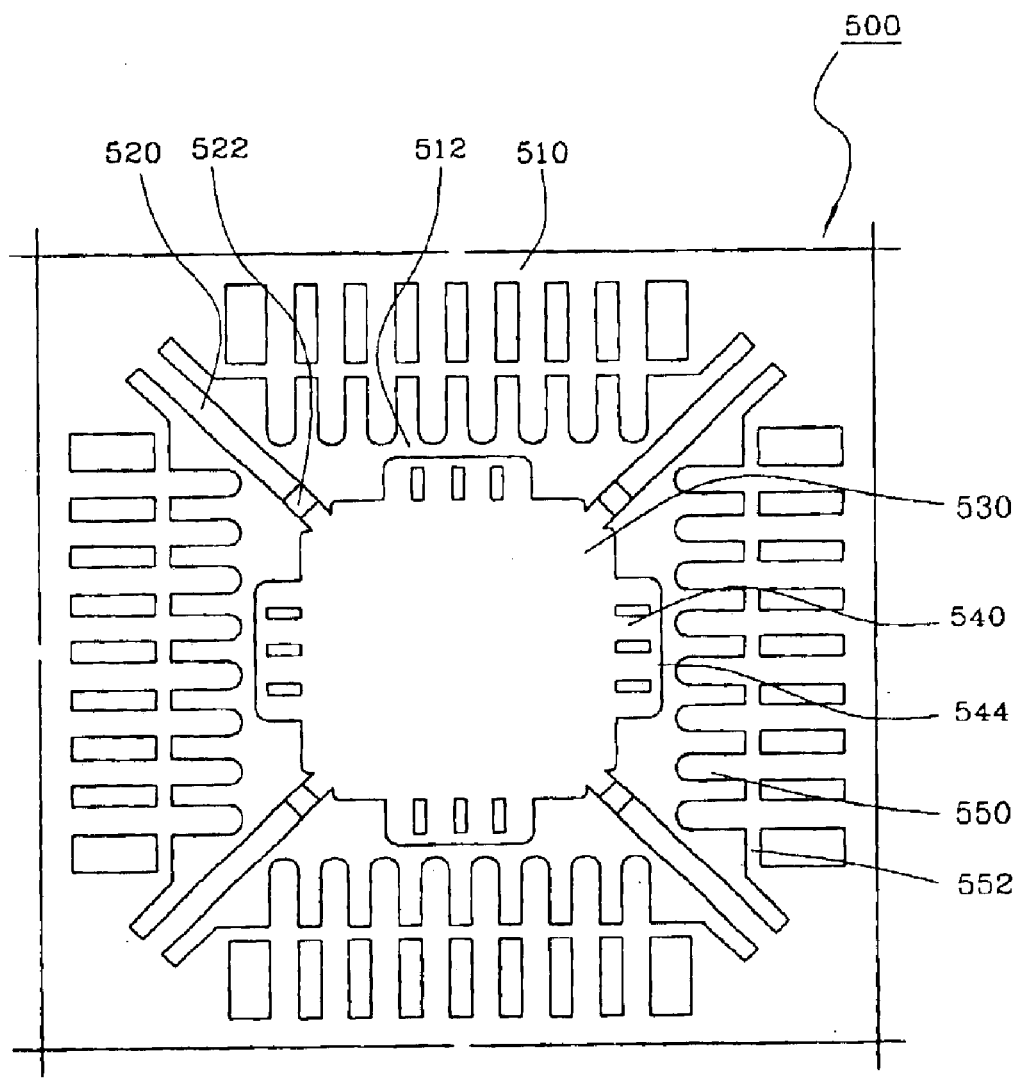
FIG. 5 is a top plan view of a leadframe used to fabricate a semiconductor package constructed in accordance with a third embodiment of the present invention.
Figure 6A:
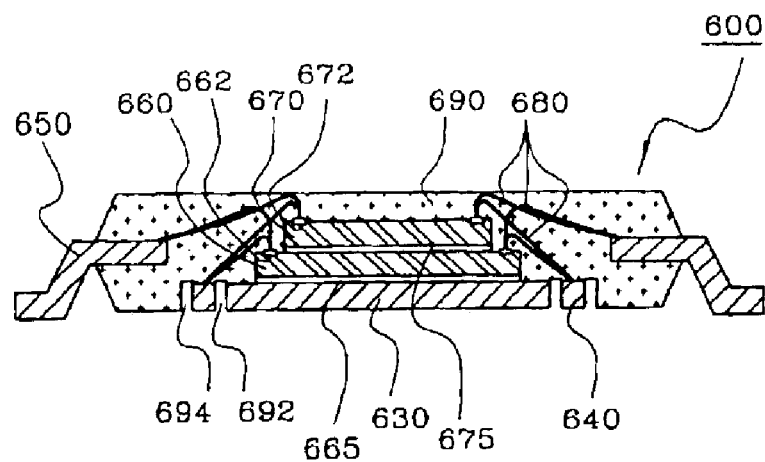
FIG. 6A is a cross-sectional view of the semiconductor package of the third embodiment.
Figure 6B:
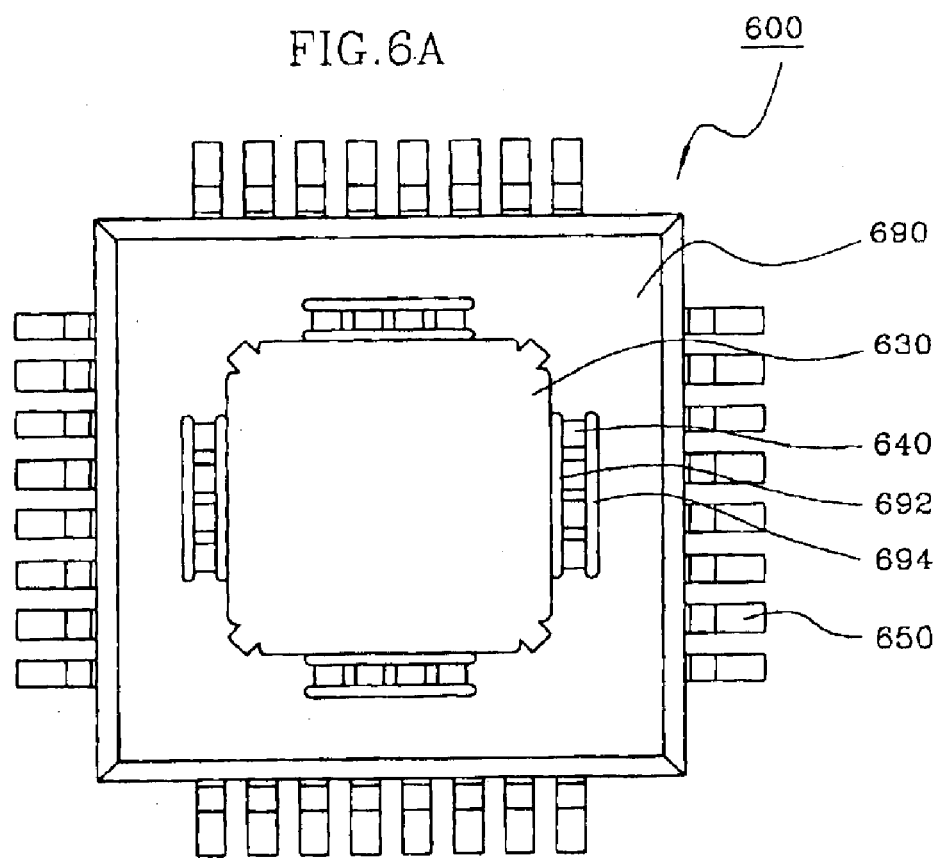
FIG. 6B is a bottom plan view of the semiconductor package of the third embodiment shown in FIG. 6A.

FIG. 5 provides a plan view of a leadframe 500 which is used to fabricate a semiconductor package 600 constructed in accordance with a third embodiment of the present invention, as is seen in FIGS. 6A and 6B. The leadframe 500 is generally planar, and includes a peripheral outer frame 510 which is quadrangular in shape and defines a central opening 512. Located within the central opening 512 of the outer frame 510 is a die paddle 530. The die paddle 530 is connected to the outer frame 510 by a plurality of tie bars 520 which extend diagonally from respective ones of the four corners defined by the die paddle 530. In addition to the outer frame 510, tie bars 520 and die paddle 530, the leadframe 500 includes a plurality of first leads 540 which are connected to the die paddle 530, and a plurality of second leads 550 which are connected to the outer frame 510 and extend within the central opening 512 toward the die paddle 530.

The second leads 550 are segregated into four sets, with the second leads 550 of each set extending toward a respective one of the four sides defined by the die paddle 530 in spaced relation thereto. The first leads 540 are also segregated into four sets, with the first leads 540 of each set being connected to and extending perpendicularly from respective ones of the peripheral sides of the die paddle 530. The distal ends of the leads 540 of each set are connected to a supporting bar 544. Thus, the four supporting bars 544 included in the leadframe 500 effectively interconnect the first leads 540 of the corresponding sets thereof to each other.

In the leadframe 500, the generally planar die paddle 530 does not extend in co-planar relation to the generally planar outer frame 510. Rather, each tie bar 520 is formed to include a downset portion 522 which results in the die paddle 530 residing on a plane which is disposed below the plane of the outer frame 510. In the leadframe 500, dambars 552 are used to provide support to the second leads 550 by connecting the second leads 550 to the outer frame 510 and to each other.

The semiconductor package 600 fabricated through the use of the leadframe 500 is shown in FIGS. 6A and 6B. The various elements labeled with the 600 series reference numerals in FIGS. 6A and 6B correspond to the same elements labeled with the 200 and 500 series reference numerals in FIGS. 2A, 2B and 5. In the semiconductor package 600, formed in the bottom surface of the package body 690 are four generally straight recesses 692. The recesses 692 are formed in a manner effectively separating or electrically isolating the first leads 640 of each set from the die paddle 630. In addition to the recesses 692, formed in the bottom surface of the package body 690 are four generally straight recesses 694. The recesses 694 are themselves formed in a manner effectively removing the above-described supporting bars 544 from the leadframe 500, thus electrically isolating the first leads 640 from each other. As seen in FIG. 6B, each recess 692 extends in spaced, generally parallel relation to a corresponding recess 694, the recesses 692, 694 of each pair extending along respective ones of the opposed ends of the first leads 640 of each set. The manufacturing process for the semiconductor package 600 essentially mirrors that used in relation to the semiconductor package 200 as described above, except that the recesses 692, 694 shown in FIGS. 6A and 6B are formed in the bottom surface of the package body 690 in the aforementioned locations.

Figure 7:
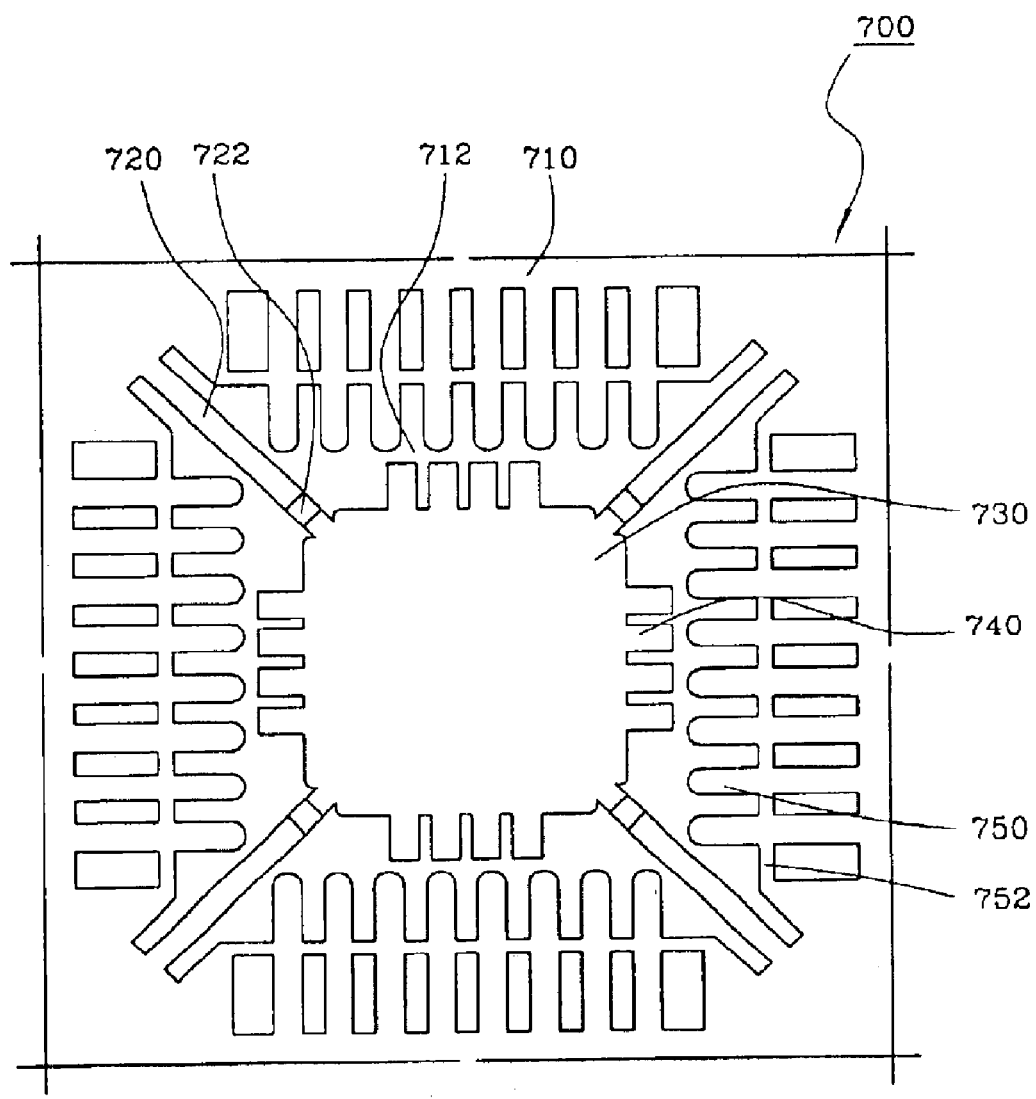
FIG. 7 is a top plan view of a leadframe used to fabricate a semiconductor package constructed in accordance with a fourth embodiment of the present invention.
Figure 8A:
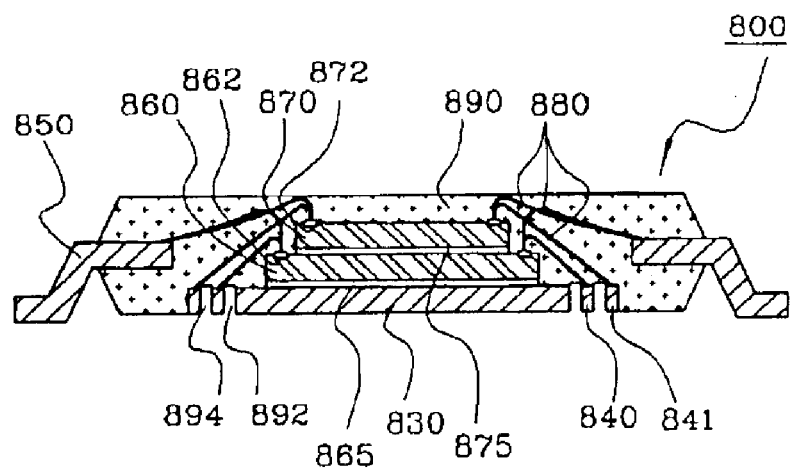
FIG. 8A is a cross-sectional view of the semiconductor package of the fourth embodiment.
Figure 8B:
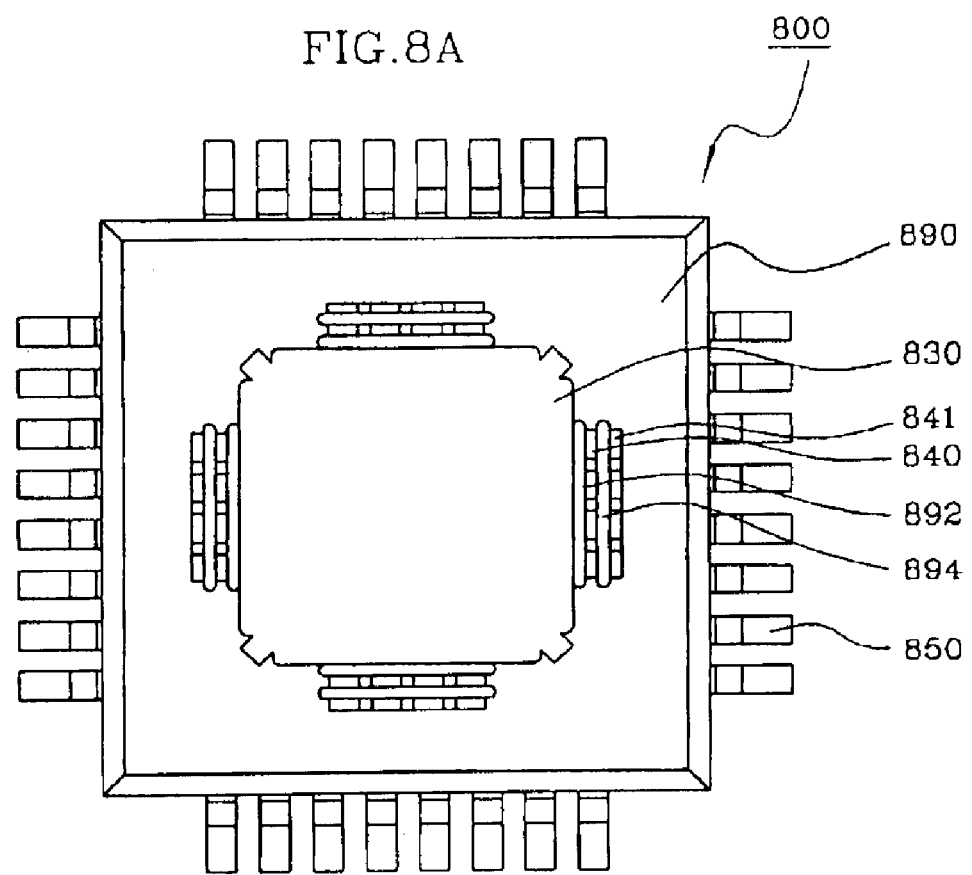
FIG. 8B is a bottom plan view of the semiconductor package of the fourth embodiment shown in FIG. 8A.

Referring now to FIG. 7, there is shown a leadframe 700 constructed in accordance with a fourth embodiment of the present invention which is used to fabricate a semiconductor package 800 of a fourth embodiment as is seen in FIGS. 8A and 8B. The leadframe 700 is substantially similar in structure to the leadframe 500 of the third embodiment described above. In this regard, various elements labeled with the 700 series reference numerals in FIG. 7 correspond to the same elements labeled with the 500 series reference numerals in FIG. 5. The structural distinction between the leadframes 700, 500 lies in that the leadframe 700 does not include the supporting bars 544 described above in relation to the leadframe 500. In this regard, the distal ends of the first lead 740 of each set included in the leadframe 700 are free, and are not interconnected.

The semiconductor package 800 fabricated through the use of the leadframe 700 is shown in FIGS. 8A and 8B. The various elements labeled with the 800 series reference numerals in FIGS. 8A and 8B correspond to the same elements labeled with the 600 and 700 series reference numerals in FIGS. 6A, 6B and 7. The primary distinction between the semiconductor package 800 and the semiconductor package 600 lies in the orientation of the recesses 894 in the semiconductor package 800 as compared to the recesses 694 in the semiconductor package 600. In the semiconductor package 800, the recesses 892 have the same orientations as the recesses 692 of the semiconductor package 600. In this regard, like the recesses 692, the recesses 892 of the semiconductor package 800 are used to separate or electrically isolate the first leads 840 of each set from the die paddle 830. Rather than being used to effectuate the removal of the supporting bar 544 described above, each recess 894 is formed in the bottom surface of the package body 890 of the semiconductor package 800 in a manner effectively cutting the first leads 840 of each set in half, thus resulting in the formation of four sets of third leads 841 corresponding to respective sets of the first leads 840. In the semiconductor package 800, additional conductive wires 880 are used to electrically connect certain bond pads 862, 872 of the semiconductor dies 860, 870 to the top surfaces of the third leads 841 in addition to the top surfaces of the first leads 840. The conductive wires 880 are also used to electrically connect certain bond pads 862, 872 to the top surfaces of the second leads 850.

The manufacturing process for the semiconductor package 800 essentially mirrors that used in relation to the semiconductor package 600 as described above. In this regard, the distinction lies in the formation of the second recesses 894 in the bottom surface of the package body 890 in locations effectively cutting each of the first leads 840 in half, thus resulting in the formation of the third leads 841.

Figure 10:
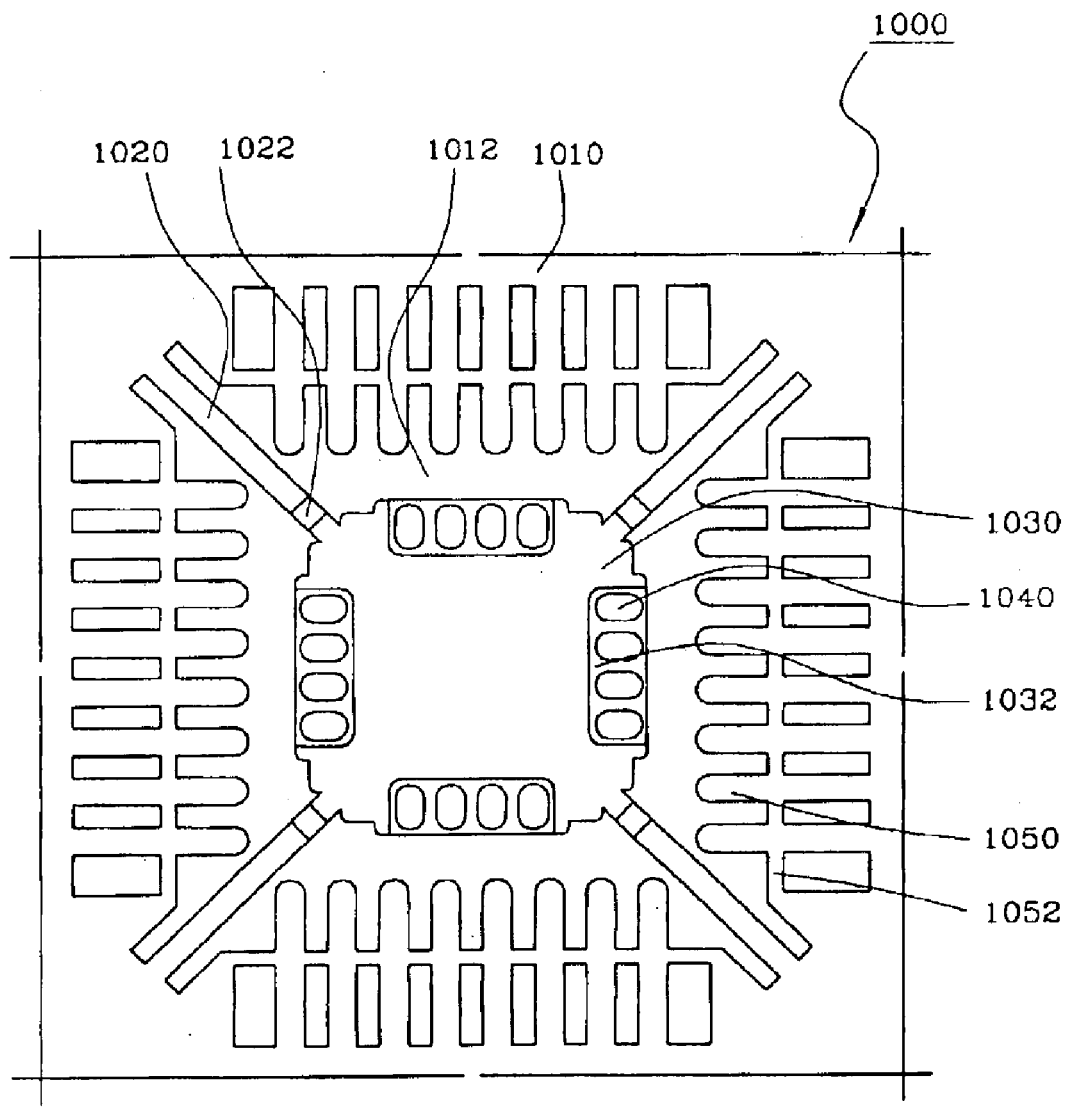
FIG. 10 is a top plan view of a leadframe used to fabricate a semiconductor package constructed in accordance with a fifth embodiment of the present invention.
Figure 11A:
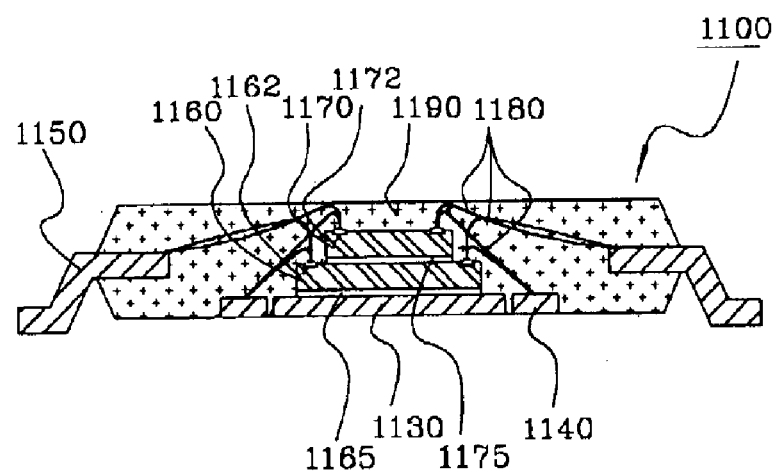
FIG. 11A is a cross-sectional view of the semiconductor package of the fifth embodiment.
Figure 11B:
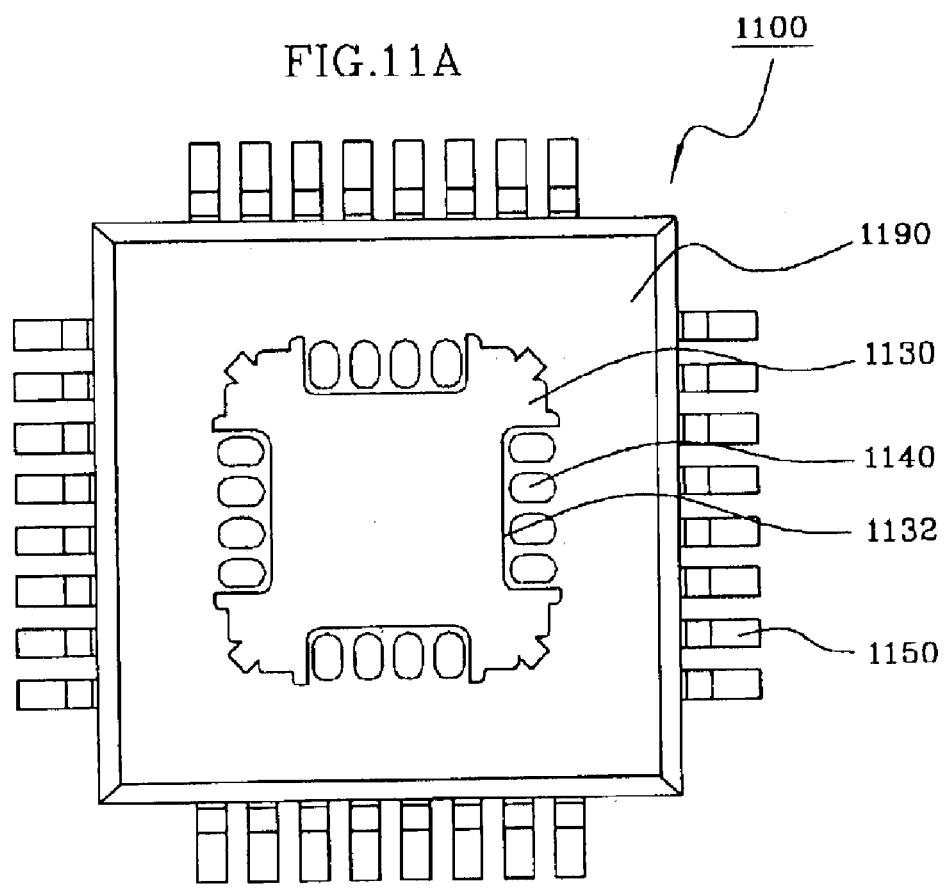
FIG. 11B is a bottom plan view of the semiconductor package of the fifth embodiment shown in FIG. 11A.

Referring now to FIG. 10, there is shown a leadframe 1000 constructed in accordance with a fifth embodiment of the present invention which is used to fabricate a semiconductor package 1100 of a fifth embodiment as is seen in FIGS. 11A and 11B. The leadframe 1000 is similar in structure to the leadframe 100 of the first embodiment described above. In this regard, various elements labeled with the 1000 series reference numerals in FIG. 10 correspond to the same elements labeled with the 100 series reference numerals in FIG. 1. In the leadframe 1000, four etched portions 1032 are formed in the die paddle 1030 as an alternative to the above-described slots 132 of the leadframe 100. The formation of the etched portions 1032 effectively results in the definition of four sets of island-type first leads 1040, the first leads 1040 of each set extending along a respective one of the four peripheral edge segments defined by the die paddle 1030. The top and bottom surfaces of the first leads 1040 extend in substantially co-planar relation to respective ones of the top and bottom surfaces of the die paddle 1030. The preferred depth of each etched portion 1032 is approximately two-thirds to three-quarters of the thickness of the die paddle 1030, and hence the total thickness of each of the first leads 1040.

The semiconductor package 1100 fabricated through the use of the leadframe 1000 is shown in FIGS. 11A and 11B. The various elements labeled with the 1100 series reference numerals in FIGS. 11A and 11B correspond to the same elements labeled with the 200 and 1000 series reference numerals in FIGS. 2A, 2B and 10. In the semiconductor package 1100, the bottom surfaces of the first leads 1140 and bottom surface of the die paddle 1130 are exposed in and substantially flush with the bottom surface of the package body 1190 of the semiconductor package 1100. The thickness of the die paddle 1130 and first leads 1140 is slightly less than the thickness of each of the second leads 1150 due to the etching of the bottom surfaces of the die paddle 1130, first leads 1140 and package body 1190 in a manner which will be described below.

Figure 12A:
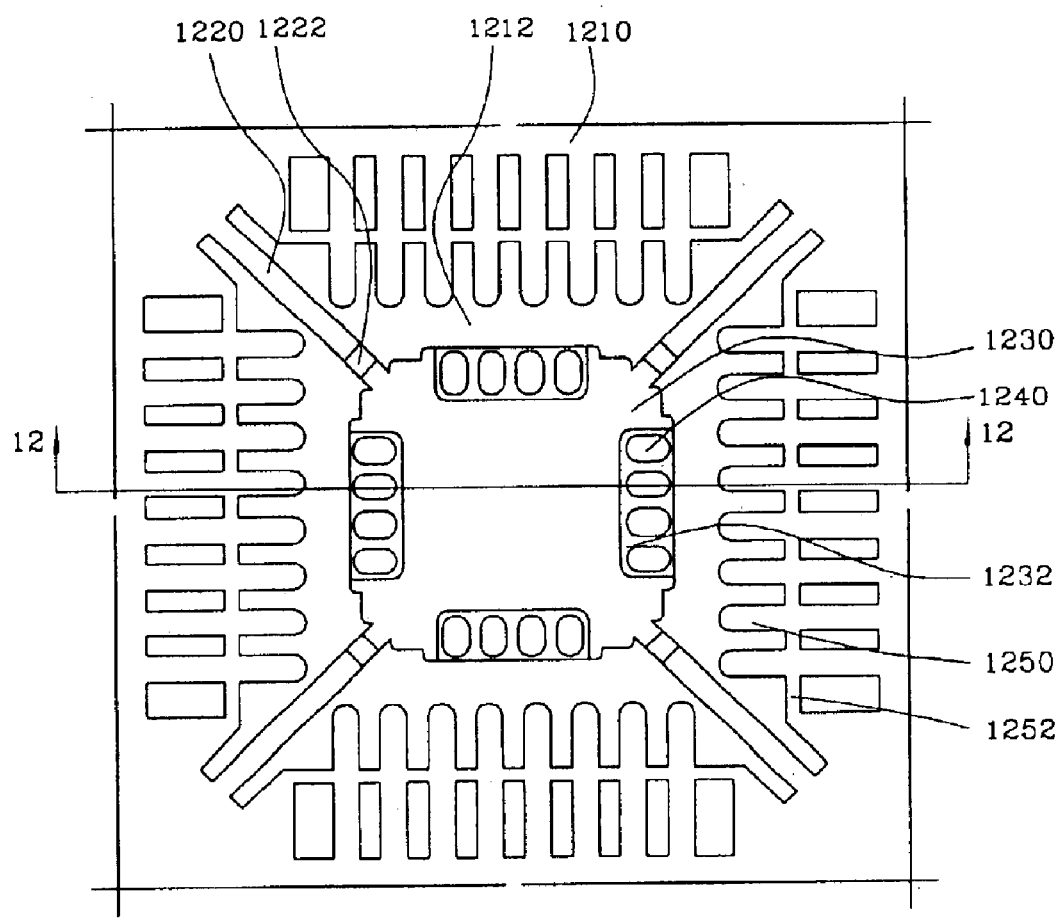
FIGS. 12A–12G are step-by-step illustrations of an exemplary method used to fabricate the semiconductor package of the fifth embodiment shown in FIGS. 11A and 11B.
Figure 12B:
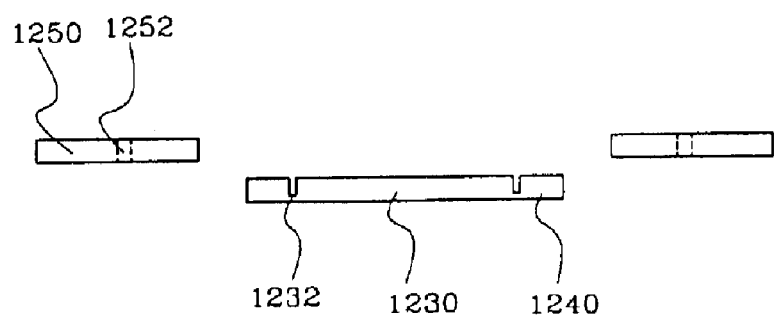
Figure 12C:
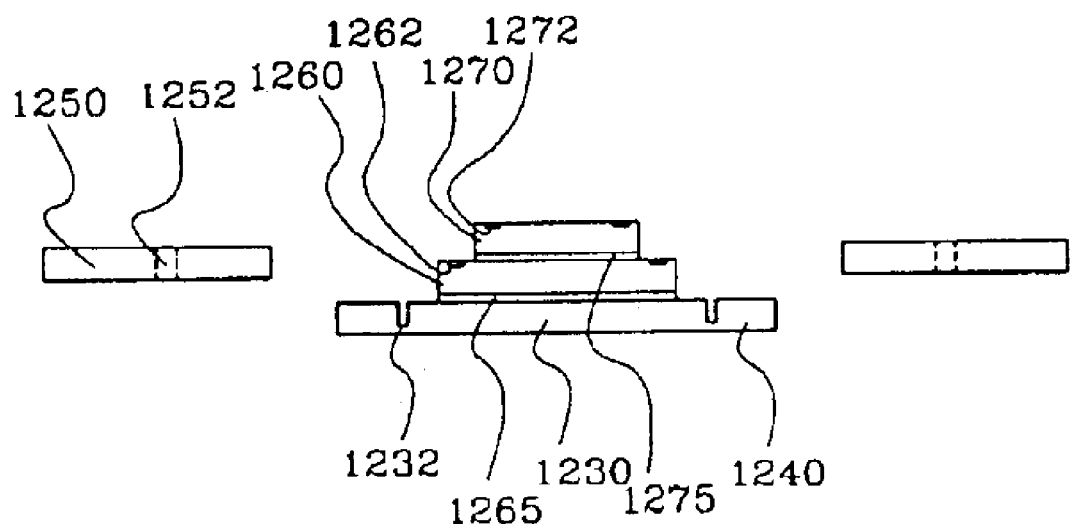
Figure 12D:
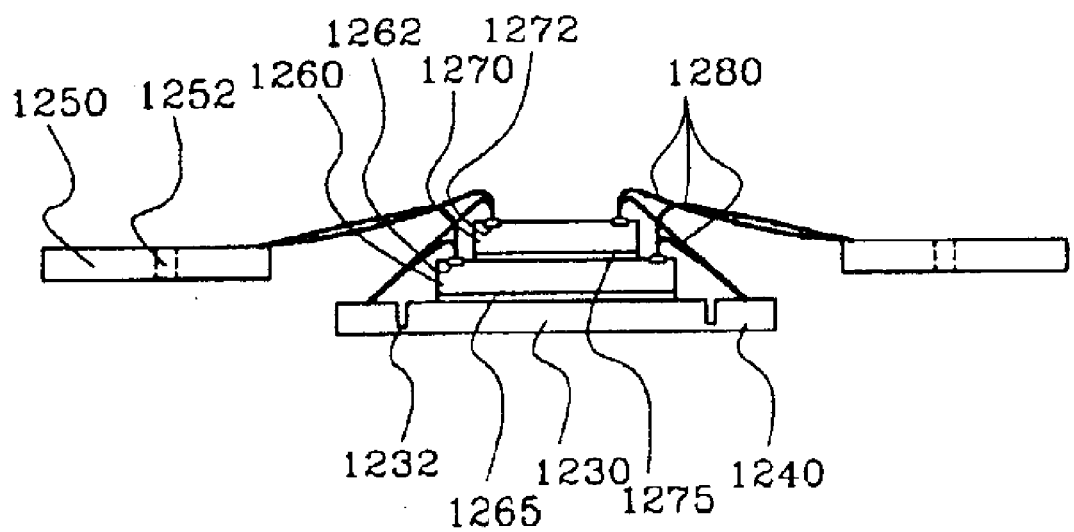

FIGS. 12A–12G provide step-by-step illustrations of an exemplary method for fabricating the semiconductor package 1100 shown in FIGS. 11A and 11B. It should be noted that the various elements labeled with the 1200 series reference numerals in FIGS. 12A–12G correspond to the same elements labeled with the 1000 and 1100 series reference numerals in FIGS. 10, 11A and 11B. In the initial steps of the exemplary method, the above-described leadframe 1000 is provided (FIGS. 12A and 12B). Thereafter, the first, lower semiconductor die 1260 is attached to the top surface of the die paddle 1230 through the use of the die attach material 1265, with the second, upper semiconductor die 1270 then being bonded to the top surface of the lower semiconductor die 1260 through the use of the die attach material 1275 (FIG. 12C). The bond pads 1262, 1272 of the semiconductor dies 1260, 1270 are then electrically connected to the first and second leads 1240, 1250 through the use of conductive wires 1280 (FIG. 12D).

Figure 12E:
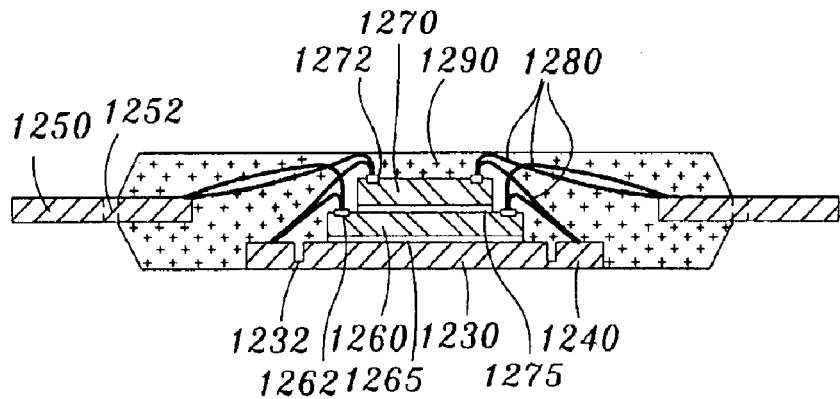
Figure 12F:
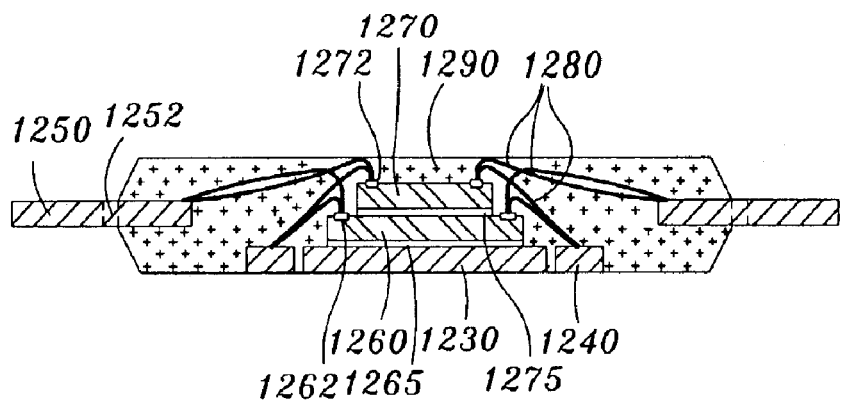
Figure 12G:
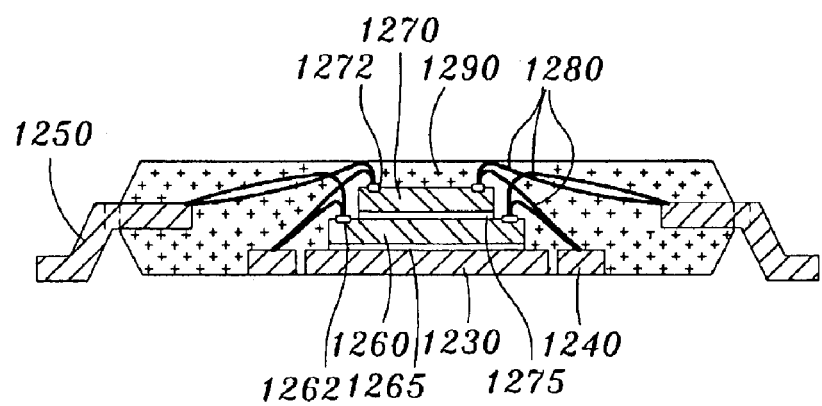

Thereafter, the package body 1290 is formed through the use of conventional molding techniques (FIG. 12E). Subsequent to the formation of the package body 1290, a partial etching step is completed (FIG. 12F). In this partial etching step., the bottom surface of the die paddle 1230 and the bottom surface of the package body 1290 are etched in a manner facilitating the removal of material sufficient to effectively electrically isolate the first leads 1240 from each other. Upon the completion of such etching, the bottom surfaces of the die paddle 1230 and first leads 1240 are exposed in and substantially flush with the bottom surface of the package body 1290. As indicated above, the completion of this etching process results in the thicknesses of the die paddle 1230 and first leads 1240 being substantially equal to each other, but slightly less than that of the second leads 1250. Either prior or subsequent to the above-described etching process, the dambars 1252 may be removed through conventional processes, thus effectively electrically isolating the second leads 1250 from each other.

The last step of the method involves the cutting or singulation of the outer frame 1210 from the tie bars 1220 and second leads 1250. Either prior or subsequent to such singulation, the second leads 1250 are subjected to a bending operation (FIG. 12G) so as to impart a generally gull-wing configuration thereto. The completion of these bending and singulation processes completes the formation of the semiconductor package 1100 shown in FIGS. 11A and 11B.

Figure 13B:
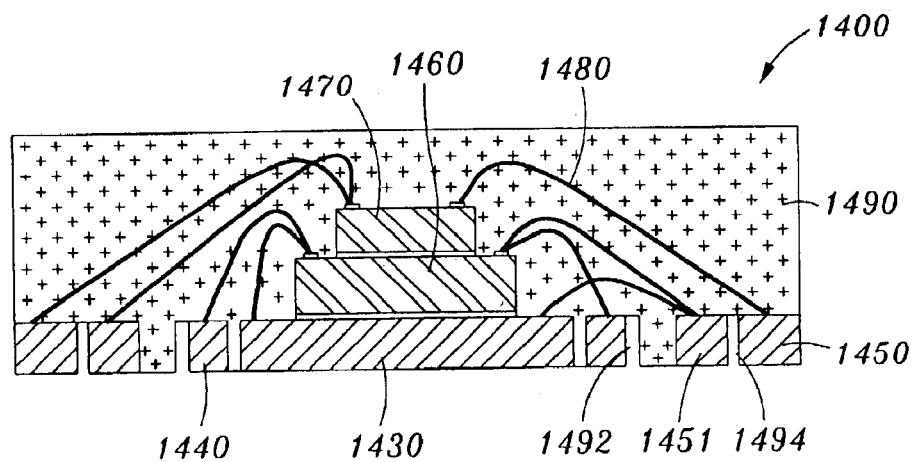
FIG. 13B is a cross-sectional view of the semiconductor package of the sixth embodiment.
Figure 13A:
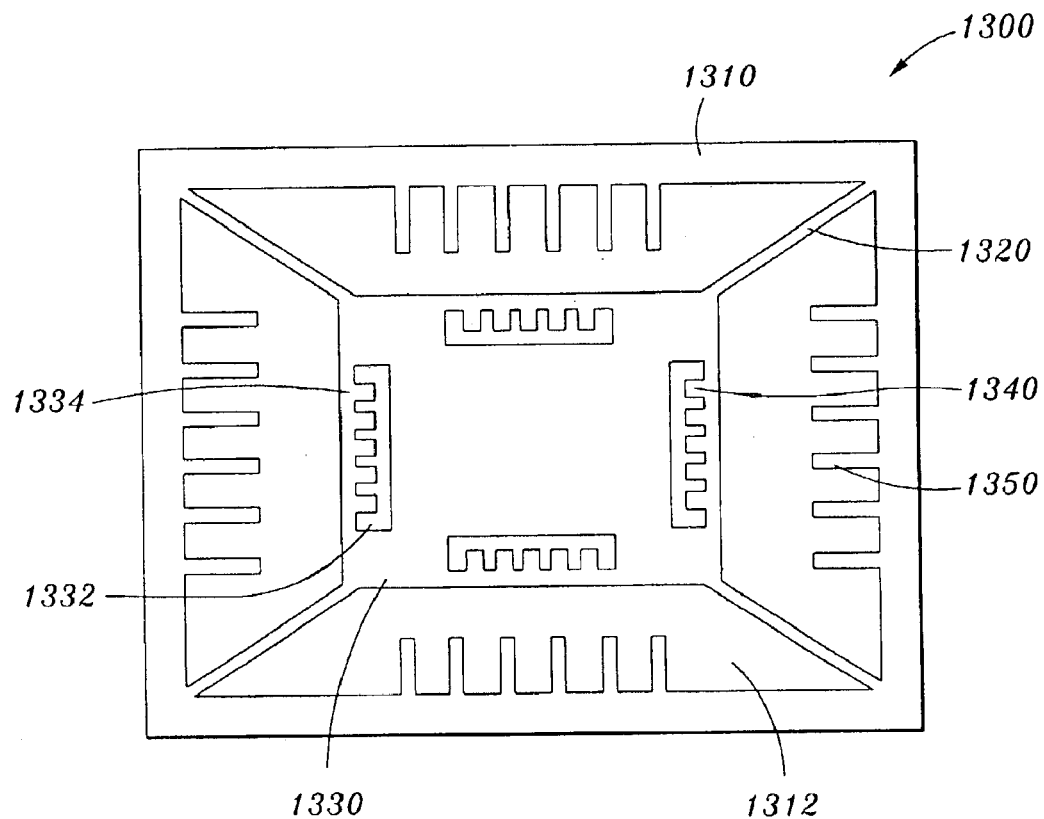
FIG. 13A is a top plan view of a leadframe used to fabricate a semiconductor package constructed in accordance with a sixth embodiment of the present invention.

Referring now to FIG. 13A, there is shown a leadframe 1300 which is used to fabricate a semiconductor package 1400 constructed in accordance with a sixth embodiment of the present invention, as is seen in FIG. 13B. The leadframe 1300 is generally planar, and includes a peripheral outer frame 1310 which is quadrangular in shape and defines a central opening 1312. Located within the central opening 1312 of the outer frame 1310 is a generally quadrangular die paddle 1330. The die paddle 1330 is connected to the outer frame 1310 by a plurality of tie bars 1320 which extend diagonally from respective ones of the four corners defined by the die paddle 1330. In addition to the outer frame 1310, tie bars 1320 and die paddle 1330, the leadframe 1300 includes a plurality of first leads 1340 which are connected to the die paddle 1330, and a plurality of second leads 1350 which are connected to the outer frame 1310 and extend within the central opening 1312 toward the die paddle 1330.

As seen in FIG. 13A, the second leads 1350 are segregated into four sets, with the second leads 1350 of each set extending toward a respective one of the four peripheral edge segments defined by the die paddle 1330 in spaced relation thereto. The first leads 1340 are also segregated into four sets which extend along respective ones of the four peripheral edge segments defined by the die paddle 1330. In the leadframe 1300, each of the first leads 1340 is defined by a respective one of four slots 1332 formed in the die paddle 1330. As a result of the inclusion of the slots 1332 therein, the die paddle 1330 defines four supporting bars 1334, each of which defines a portion of a respective one of the four peripheral edge segments of the die paddle 1330. The first leads 1340 of each set are connected to and extend inwardly from a respective one of the supporting bars 1334. In the leadframe 1000, the die paddle 1330, first and second leads 1340, 1350, and outer frame 1310 extend in generally co-planar relation to each other.

The semiconductor package 1400 fabricated through the use of the leadframe 1300 is shown in FIG. 13B. The semiconductor package 1400 includes a die paddle 1430, a plurality of first leads 1440, and a plurality of second leads 1450. As will be recognized, the die paddle 1430 corresponds to the die paddle 1330 shown in FIG. 13A, with the first and second leads 1440, 1450 corresponding to the first and second leads 1340, 1350 shown in FIG. 13A.

The semiconductor package 1400 further includes a semiconductor die 1460 which is attached to the top surface of the die paddle 1430. Additionally, attached to the top surface of the semiconductor die 1460 is another semiconductor die 1470. The bond pads of the semiconductor dies 1460, 1470 are electrically connected to the top surfaces of the first and second leads 1440, 1450 through the use of conductive wires 1480. Conductive wires 1480 may also optionally be used to electrically connect the top surface of the die paddle 1430 to the top surfaces of either the first or second leads 1440, 1450.

In the semiconductor package 1400, the die paddle 1430, first and second leads 1440, 1450, semiconductor dies 1460, 1470 and conductive wires 1480 are encapsulated by an encapsulant material which, upon hardening, forms a package body 1490 of the semiconductor package 1400. The bottom surfaces of the die paddle 1430, first leads 1440; and second leads 1450 are exposed in and substantially flush with the bottom surface of the package body 1490. The semiconductor package 1400 may be mounted to an external device through the use of the first and second leads 1440, 1450 which are exposed in the bottom surface of the package body 1490.

As is seen in FIGS. 13A and 13B, formed in the bottom surface of the package body 1490 are four generally straight recesses 1492. The recesses 1492 are formed in the bottom surface of the package body 1490 in the same manner described above in relation to the recesses 992 in a manner effectively removing the above-described supporting bars 1334 from the leadframe 1300, thus electrically isolating the first leads 1440 from the die paddle 1430 and each other. In addition to the recesses 1492, formed in the bottom surface of the package body 1490 are four generally straight recesses 1494. The recesses 1494 are formed in a manner effectively cutting each of the second leads 1450 in half, thus effectively facilitating the formation of four sets of third leads 1451. Thus, the third leads 1451 of each set are arranged in opposed relation to respective ones of the second leads 1450 of the corresponding set. As is seen in FIG. 13B, the conductive wires 1480 extend to the top surfaces of the second leads 1450 as well as the third leads 1451. As a result of the formation of the recesses 1494, the bottom surfaces of the third leads 1451, like the bottom surfaces of the first and second leads 1440, 1450 and die paddle 1430, are exposed in and substantially flush with the bottom surface of the package body 1490 of the semiconductor package 1400. The steps used to facilitate the fabrication of the semiconductor package 1400 mirror those described above in relation to the fabrication of the semiconductor package 200, except that the recesses 1494 are arranged in a manner effectively cutting the second leads 1450 in a manner facilitating the formation of the third leads 1451.

Figure 14B:
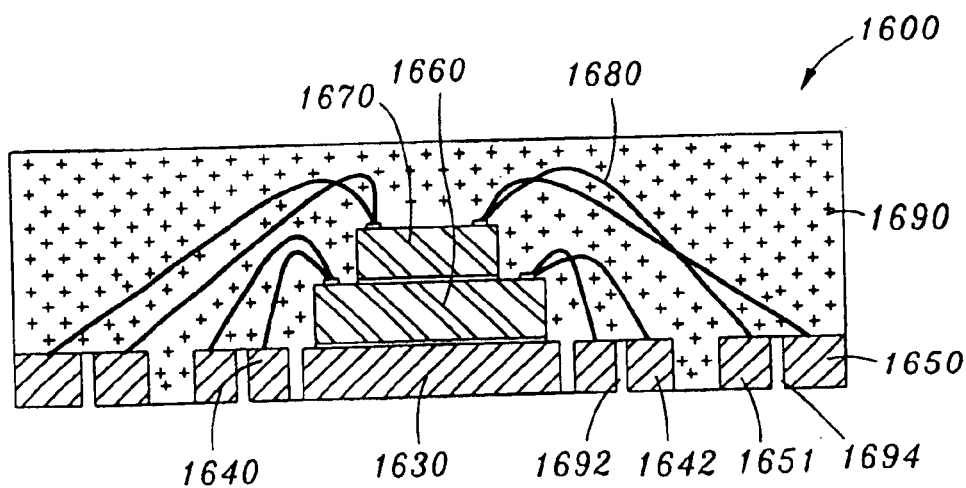
FIG. 14B is a cross-sectional view of the semiconductor package of the seventh embodiment.
Figure 14A:
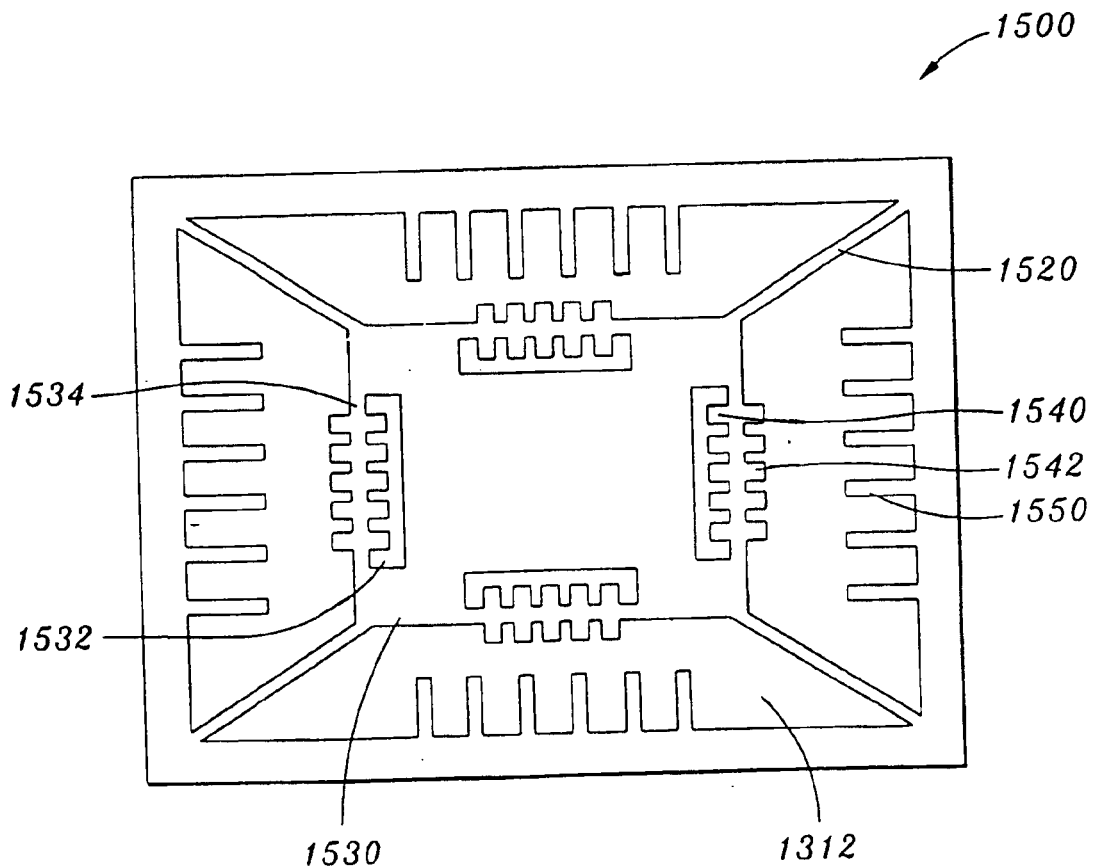
FIG. 14A is a top plan view of a leadframe used to fabricate a semiconductor package constructed in accordance with a seventh embodiment of the present invention.

Referring now to FIG. 14A, there is shown a leadframe 1500 constructed in accordance with a seventh embodiment of the present invention which is used to fabricate a semiconductor package 1600 of a seventh embodiment as is seen in FIG. 14B. The leadframe 1500 is substantially similar in structure to the leadframe 1300 of the sixth embodiment described above. In this regard, various elements labeled with the 1500 series reference numerals in FIG. 14A correspond to the same elements labeled with the 1300 series reference numerals in FIG. 13A. The structural distinction between the leadframes 1500, 1300 lies in that the leadframe 1500 further includes four sets of fourth leads 1542. The fourth leads 1542 of each set are connected to and extend outwardly from a respective one of the supporting bars 1534. The fourth leads 1542 of each set also extend in opposed relation to respective ones of the first leads 1540 of the corresponding set connected to the common supporting bar 1534. Though the first and fourth leads 1540, 1542 are shown in FIG. 14A as being located on both sides of each supporting bar 1534 symmetrically, those of ordinary skill in the art will recognize that the first and fourth leads 1540, 1542 of each set may be oriented asymmetrically relative to the common supporting bar 1534.

The semiconductor package 1600 fabricated through the use of the leadframe 1500 is shown in FIG. 14B. The various elements labeled with the 1600 series reference numerals in FIG. 14B correspond to the same elements labeled with the 1400 and 1500 series reference numerals in FIGS. 13B and 14A. The primary distinction between the semiconductor package 1600 and the semiconductor package 1400 lies in the addition of four sets of fourth leads 1642 in the semiconductor package 1600. As seen in FIG. 14B, the package body 1690 of the semiconductor package 1600 is formed such that the bottom surfaces of the die paddle 1630, and first, second and fourth leads 1640, 1650, 1642 are exposed in and substantially flush with the bottom surface of the package body 1690. The recesses 1692 formed in the bottom surface of the package body 1690 as a result of the removal of the above-described supporting bars 1534 from the leadframe 1500 electrically isolate the first and fourth leads 1640, 1642 from the die paddle 1630 and from each other. The formation of the recesses 1694 facilitates the creation of the third leads 1651, the bottom surfaces of which are also exposed in and substantially flush with the bottom surface of the package body 1690. In the semiconductor package 1600, additional conductive wires 1680 are used to electrically connect certain bond pads of the semiconductor dies 1660, 1670 to the top surfaces of the fourth leads 1642. The manufacturing process for the semiconductor package 1600 closely mirrors that used in relation to the semiconductor package 1400 described above.

As is apparent from the foregoing, the semiconductor package 1400 shown in FIG. 13B is similar to the semiconductor package 200 of the first embodiment, except that the second leads 1450 are cut to define the third leads 1451, with the bottom surfaces of both the second and third leads 1450, 1451 being exposed in and substantially flush with the bottom surface of the package body 1490, as compared to the leads 250 of the semiconductor package 200 which protrude outwardly from respective sides of the package body 290 and each have a gull-wing configuration. Along the same lines, the semiconductor package 1600 of the seventh embodiment is similar to the semiconductor package 400 of the second embodiment, except that the leads 1650 of the semiconductor package 1600 are also cut so as to further define the third leads 1651. The bottom surfaces of the second and third leads 1650, 1651 are exposed in and substantially flush with the bottom surface of the package body 1690, in contrast to the second leads 1450 of the semiconductor package 400 which protrude from respective sides of the package body 490 and each have a gull-wing configuration.

Figure 15:
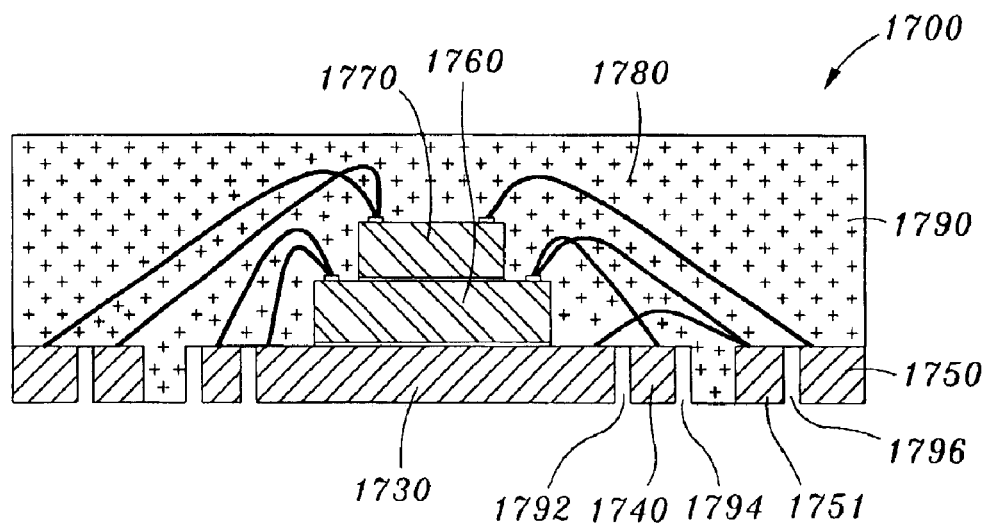
FIG. 15 is a cross-sectional view of a semiconductor package constructed in accordance with an eighth embodiment of the present invention.

Referring now to FIG. 15, there is shown in cross-section a semiconductor package 1700 constructed in accordance with an eighth embodiment of the present invention. Similar to the correlation between the semiconductor packages 200 and 1400, and between the semiconductor packages 400 and 1600, the semiconductor package 1700 corresponds to the semiconductor package 600 of the third embodiment. The 1700 series reference numerals are used in FIG. 8 to label elements corresponding to those labeled with the 600 series reference numerals in FIGS. 6A and 6B. In the semiconductor package 1700, four generally straight recesses 1796 are formed in the bottom surface of the package body 1790 in addition to the four recesses 1792 and four recesses 1794. The recesses 1796 are formed as a result of the cutting of the second leads 1750 of each of the four sets in a manner defining the four sets of corresponding third leads 1751. Thus, though being similar to the semiconductor package 600, the semiconductor package 1700 differs in that the bottom surfaces of both the second and third leads 1750, 1751 are exposed in and substantially flush with the bottom surface of the package body 1790, in contrast to only the second leads 650 extending from respective sides of the package body 690 in the case of the semiconductor package 600.

Figure 16:
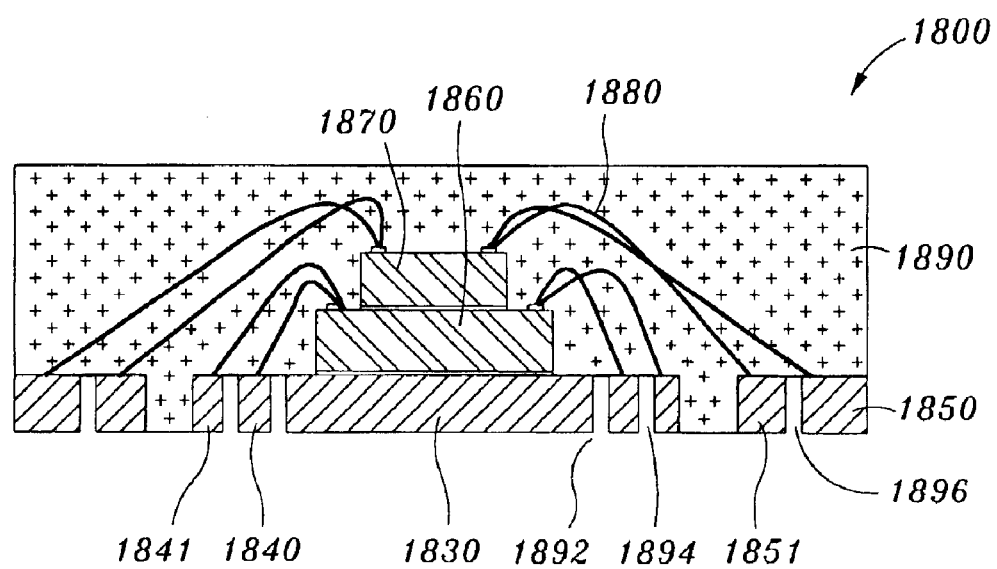
FIG. 16 is a cross-sectional view of a semiconductor package constructed in accordance with a ninth embodiment of the present invention.

Referring now to FIG. 16, there is shown a semiconductor package 1800 constructed in accordance with a ninth embodiment of the present invention. The semiconductor package 1800 generally corresponds to the semiconductor package 800 of the fourth embodiment shown in FIGS. 8A and 8B. In this regard, the elements labeled with the 1800 series reference numerals in FIG. 16 correspond to those labeled with the 800 series reference numerals in FIGS. 8A and 8B. However, in the semiconductor package 1800, four additional generally straight recesses 1896 are formed in the bottom surface of the package body 1890, in addition to the four recesses 1892 and four recesses 1894. The four additional recesses 1896 are used to effectively cut the second leads 1850 in a manner facilitating the formation of the four sets of fourth leads 1851. Thus, in the semiconductor package 1800, the bottom surfaces of the second and fourth leads 1850, 1851 are each exposed in and substantially flush with the bottom surface of the package body 1890, in contrast to the second leads 850 of the semiconductor package 800 which have generally gull-wing configurations and protrude from respective side surfaces of the package body 890.

Figure 17:
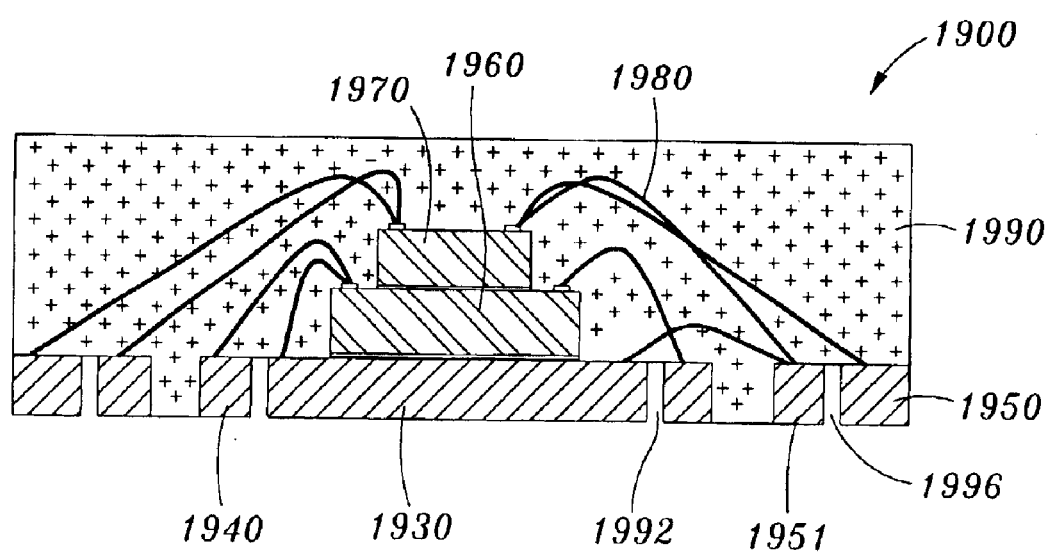
FIG. 17 is a cross-sectional view of a semiconductor package constructed in accordance with a tenth embodiment of the present invention.

FIG. 17 is a cross-sectional view of a semiconductor package 1900 constructed in accordance with a tenth embodiment of the present invention. The semiconductor package 1900 is similar to the semiconductor package 800 of the fourth embodiment shown in FIGS. 8A and 8B. In this regard, the 1900 series reference numerals shown in FIG. 17 are used to label elements corresponding to those labeled with the 800 series reference numerals in FIGS. 8A and 8B. However, the semiconductor package 1900 does not include the four recesses 894 included in the semiconductor package 800. Thus, the first leads 1940 of the semiconductor package 1900 are not cut in half, but rather are electrically isolated from the die paddle 1930 and from each other by respective ones of the four recesses 1992 formed in the bottom surface of the package body 1990. In the semiconductor package 1900, four additional, generally straight recesses 1996 are formed in the bottom surface of the package body 1990 as a result of the sawing or cutting process used to effectively cut the second leads 1950 in a manner facilitating the formation of the four sets of third leads 1951. The bottom surfaces of the second and third leads 1950, 1951 are exposed in and substantially flush with the bottom surface of the package body 1990, as are the bottom surfaces of the first leads 1940 and die paddle 1930.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A leadframe, comprising:
   a generally quadrangular outer frame defining a central opening;
   a generally planar die paddle disposed within the central opening and defining multiple peripheral edge segments;
   at least one tie bar attached to and extending between the die paddle and the outer frame;
   a plurality of first leads attached to and extending from at least two peripheral edge segments of the die paddle; and
   a plurality of second leads attached to the outer frame and extending within the central opening toward at least two peripheral edge segments of the die paddle.

2. The leadframe of claim 1 wherein the first leads are segregated into at least two sets which are defined by respective ones of at least two slots formed within the die paddle and extending along respective ones of at least two peripheral edge segments thereof.

3. The leadframe of claim 2 wherein at least portions of at least two of the peripheral edge segments of the die paddle are defined by respective ones of at least two supporting bars, each set of the first leads being connected to and extending inwardly from a common side of a respective one of the supporting bars.

4. The leadframe of claim 3 further comprising a plurality of third leads segregated into at least two sets, the third leads of each set being connected to and extending outwardly from a common side of a respective one of the supporting bars.

5. The leadframe of claim 1 wherein:
   the first leads are segregated into at least two sets which are attached to and protrude into the central opening from respective ones of at least two peripheral edge segments of the die paddle; and
   the first leads of each set define distal ends which are interconnected by a respective one of at least two supporting bars.

6. The leadframe of claim 1 wherein the first leads are defined by at least two etched portions formed in the die paddle along respective ones of at least two peripheral edge segments thereof.

7. The leadframe of claim 6 wherein:
   the die paddle defines opposed top and bottom surfaces;
   each of the first leads defines opposed top and bottom surfaces; and
   the top surfaces of the first leads extend in generally co-planar relation to the top surface of the die paddle.

8. The leadframe of claim 1 wherein each of the tie bars is formed to include a downset portion such that the die paddle and the first leads extend along a first plane and the second leads extend along the second plane which is disposed in spaced, generally parallel relation to the first plane.

9. A semiconductor package comprising:
   a generally planar die paddle defining opposed top and bottom surfaces and multiple peripheral edge segments, the die paddle including at least two slots formed therein and extending along respective ones of the peripheral edge segments thereof;
   a plurality of first leads defining opposed top and bottom surfaces, the first leads being segregated into at least two sets which are disposed within respective ones of the slots of the die paddle;
   a plurality of second leads defining opposed top and bottom surfaces, the second leads being segregated into at least two sets which extend along respective ones of at least two peripheral edge segments of the die paddle in spaced relation thereto;

a first semiconductor die attached to the top surface of the die paddle and electrically connected to at least one of each of the first and second leads; and a package body at least partially encapsulating the first and second leads and the semiconductor die such that at least the bottom surface of the die paddle and the bottom surfaces of the first leads are exposed in the package body.

10. The semiconductor package of claim 9 further comprising a second semiconductor die attached to the first semiconductor die and electrically connected to at least one of each of the first and second leads, the first and second semiconductor dies being encapusulated by the package body.

11. The semiconductor package of claim 9 wherein:

the package body defines multiple side surfaces; and the second leads protrude from respective side surfaces of the package body.

12. The semiconductor package of claim 9 wherein:

the package body defines a generally planar bottom surface; and the bottom surfaces of the die paddle, first leads and second leads are exposed in and substantially flush with the bottom surface of the package body.

13. The semiconductor package of claim 9 further comprising a plurality of third leads segregated into at least two sets extending between respective pairs of the first and second leads, each of the third leads defining a bottom surface which is exposed in the package body, the semiconductor die being electrically connected to at least one of the third leads.

14. The semiconductor package of claim 13 further comprising at least two inner recesses disposed within the package body and separating each set of the first leads from a respective set of the third leads.

15. The semiconductor package of claim 14 further comprising a plurality of fourth leads segregated into at least two sets extending between respective pairs of the second and third leads, each of the fourth leads defining a bottom surface which is exposed in the package body, the semiconductor die being electrically connected to at least one of the fourth leads.

16. The semiconductor package of claim 15 further comprising at least two outer recesses disposed within the package body and separating each set of the second leads from a respective set of the fourth leads.

17. A semiconductor package, comprising:

a die paddle defining opposed top and bottom surfaces and multiple peripheral edge segments;

a plurality of first leads defining opposed top and bottom surfaces, the first leads being segregated into at least two sets which are attached to and extend from respective ones of at least two of the peripheral edge segments of the die paddle;

a plurality of second leads defining opposed top and bottom surfaces, the second leads being segregated into at least two sets which extend along respective ones of at least two of the peripheral edge segments of the die paddle in spaced relation thereto;

a first semiconductor die attached to the top surface of the die paddle and electrically connected to at least one of each of the first and second leads; and a package body at least partially encapsulating the first and second leads and the semiconductor die such that at least the bottom surface of the die paddle and the bottom surfaces of the first leads are exposed in the package body.

18. The semiconductor package of claim 17 wherein the at least two sets of the first leads are defined by respective ones of at least two slots which are formed within the die paddle and extend along respective ones of at least two of the peripheral edge segments thereof.

19. The semiconductor package of claim 18 wherein at least portions of at least two of the peripheral edge segments of the die paddle are defined by respective ones of at least two supporting bars, each set of the first leads being connected to and extending inwardly from a common side of a respective one of the supporting bars.

20. The semiconductor package of claim 17 further comprising a second semiconductor die attached to the first semiconductor die and electrically connected to at least one of each of the first and second leads, the first and second semiconductor dies being encapusulated by the package body.

21. The semiconductor package of claim 17 wherein:

the package body defines multiple side surfaces; and the second leads protrude from respective side surfaces of the package body.

22. The semiconductor package of claim 17 wherein:

the package body defines a generally planar bottom surface; and the bottom surfaces of the die paddle and the first leads are exposed in and substantially flush with the bottom surface of the package body.

23. The semiconductor package of claim 17 wherein:

the die paddle has a generally quadrangular configuration and defines at least four peripheral edge segments; and the first leads are segregated into four sets which are attached to and extend from respective ones of the at least four peripheral edge segments of the die paddle.

24. The semiconductor package of claim 23 wherein:

the second leads are segregated into four sets which extend along respective ones of the at least four peripheral edge segments of the die paddle in spaced relation thereto.

* * * * *